US012622030B2

(12) United States Patent
Saitoh et al.

(10) Patent No.: US 12,622,030 B2
(45) Date of Patent: May 5, 2026

(54) SILICON CARBIDE SEMICONDUCTOR DEVICE

(71) Applicant: SUMITOMO ELECTRIC INDUSTRIES, LTD., Osaka (JP)

(72) Inventors: Yu Saitoh, Osaka (JP); Takeyoshi Masuda, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 385 days.

(21) Appl. No.: 18/568,006

(22) PCT Filed: May 31, 2022

(86) PCT No.: PCT/JP2022/022109
§ 371 (c)(1),
(2) Date: Dec. 7, 2023

(87) PCT Pub. No.: WO2022/270245
PCT Pub. Date: Dec. 29, 2022

(65) Prior Publication Data
US 2024/0282824 A1 Aug. 22, 2024

(30) Foreign Application Priority Data

Jun. 23, 2021 (JP) ................................. 2021-104166

(51) Int. Cl.
*H10D 12/00* (2025.01)
*H10D 30/01* (2025.01)
(Continued)

(52) U.S. Cl.
CPC ..... *H10D 62/8325* (2025.01); *H10D 30/0297* (2025.01); *H10D 30/668* (2025.01); *H10D 62/393* (2025.01)

(58) Field of Classification Search
CPC .... H10D 12/00; H10D 12/38; H10D 30/0297; H10D 30/668; H10D 30/665;
(Continued)

(56) References Cited

U.S. PATENT DOCUMENTS

2014/0027784 A1    1/2014  Wada et al.
2015/0380485 A1*  12/2015  Wada ................... H10D 62/157
                                                              257/77
(Continued)

FOREIGN PATENT DOCUMENTS

JP        2014-041990        3/2014
JP        2021-027138        2/2021
(Continued)

*Primary Examiner* — Omar F Mojaddedi

(74) *Attorney, Agent, or Firm* — IPUSA, PLLC

(57) ABSTRACT

A silicon carbide semiconductor device includes a silicon carbide substrate that has first and second main surfaces and that includes a drift region being of a first-conductivity-type, a body region provided on the drift region and being of a second-conductivity-type, a source region provided on the body region and being of the first-conductivity-type, and a first electric field relaxation region being of the second-conductivity-type and including a first plane in which an impurity-concentration of the second-conductivity-type is a maximum and a second plane in which the impurity-concentration of the second-conductivity-type of $1/10$ of the maximum, the second plane being closer to the second main surface than the first plane is. A distance between the first and second planes is 1.0 μm or greater, and a distance from the first main surface to an interface between the first electric field relaxation region and the drift region is 2.0 μm or greater.

8 Claims, 15 Drawing Sheets

(51) Int. Cl.
_H10D 30/66_ (2025.01)
_H10D 62/17_ (2025.01)
_H10D 62/832_ (2025.01)

(58) Field of Classification Search
CPC ............. H10D 62/8325; H10D 62/393; H10D 62/105; H10D 62/106; H10D 62/107; H10D 62/157
See application file for complete search history.

(56) References Cited

U.S. PATENT DOCUMENTS

| | | | |
|---|---|---|---|
| 2017/0263757 A1* | 9/2017 | Saikaku ............... | H10D 30/668 |
| 2018/0076285 A1* | 3/2018 | Tanaka ................. | H10D 12/481 |
| 2019/0074360 A1* | 3/2019 | Hiyoshi ............ | H10D 62/8325 |
| 2019/0348524 A1* | 11/2019 | Ebiike .................. | H10D 30/027 |
| 2021/0036116 A1 | 2/2021 | Kyogoku et al. | |
| 2021/0098620 A1* | 4/2021 | Tominaga ............ | H10D 30/665 |
| 2021/0183995 A1 | 6/2021 | Kobayashi et al. | |

FOREIGN PATENT DOCUMENTS

| | | |
|---|---|---|
| WO | 2016/157606 | 10/2016 |
| WO | 2017/179377 | 10/2017 |
| WO | 2020/110514 | 6/2020 |

* cited by examiner

FIG.12

SILICON CARBIDE SEMICONDUCTOR DEVICE

TECHNICAL FIELD

The present disclosure relates to a silicon carbide semiconductor device.

This application claims priority to Japanese Patent Application No. 2021-104166 filed on Jun. 23, 2021, the entire contents of which are incorporated herein by reference.

BACKGROUND ART

As one of the silicon carbide semiconductor devices, a metal oxide semiconductor field effect transistor (MOSFET) including a gate trench passing through a source region and a body region is disclosed (for example, Patent Document 1).

CITATION LIST

Patent Document

[Patent Document 1] Japanese Laid-open Patent Application Publication No. 2014-41990

SUMMARY OF THE INVENTION

A silicon carbide semiconductor device includes a silicon carbide substrate having a first main surface and a second main surface opposite to the first main surface. The silicon carbide substrate includes a drift region being of a first conductivity type; a body region provided on the drift region, the body region being of a second conductivity type different from the first conductivity type; and a source region provided on the body region so as to be separated from the drift region, the source region being of the first conductivity type. A gate trench is provided on the first main surface. The gate trench is defined by side surfaces passing through the source region and the body region to reach the drift region and a bottom surface continuous with the side surfaces. The silicon carbide substrate further includes a first electric field relaxation region provided between the bottom surface and the second main surface, the first electric field relaxation region being of the second conductivity type. The first electric field relaxation region includes, in a direction perpendicular to the first main surface, a first plane in which a concentration of an impurity of the second conductivity type is a maximum value, and a second plane, in which a concentration of the impurity of the second conductivity type is $1/10$ of the maximum value, and the second plane is closer to the second main surface than the first plane is. A distance between the first plane and the second plane is 1.0 μm or greater, and a distance from the first main surface to an interface that is between the first electric field relaxation region and the drift region is 2.0 μm or greater.

BRIEF DESCRIPTION OF THE DRAWINGS

FIG. 12 is a cross-sectional view (part 9) illustrating the method for manufacturing the silicon carbide semiconductor device according to the embodiment.

EMBODIMENT FOR CARRYING OUT THE INVENTION

Figure 1:
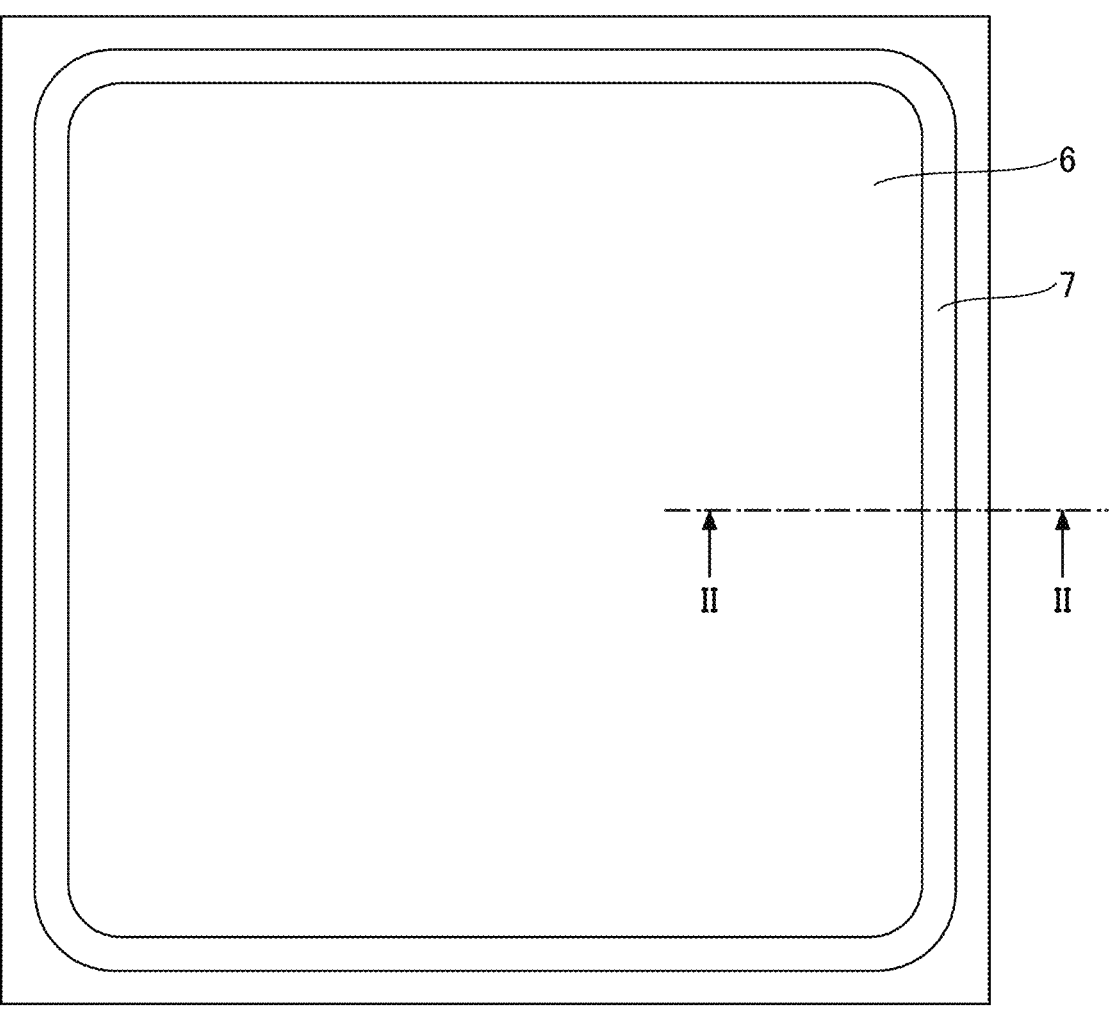
FIG. 1 is a drawing illustrating a layout of a silicon carbide semiconductor device according to an embodiment.

Problems to be Solved by the Present Disclosure

In order to manufacture a conventional silicon carbide semiconductor device, it is necessary to form an epitaxial layer on a silicon carbide single-crystal substrate multiple times. In order to reduce the cost, it is desired to reduce the number of times of forming the epitaxial layer.

It is an object of the present disclosure to provide a silicon carbide semiconductor device in which the number of times of forming an epitaxial layer can be reduced.

Effects of the Present Disclosure

According to the present disclosure, the number of times of forming an epitaxial layer can be reduced.

Embodiments will be described below.

DESCRIPTION OF EMBODIMENTS OF THE PRESENT DISCLOSURE

First, embodiments of the present disclosure will be listed and described. In the following description, identical or corresponding elements are referenced by the same reference signs and the description thereof will not be described repeatedly. In crystallographic description in the present specification, an individual orientation is indicated by [ ], a group orientation is indicated by < >, an individual plane is indicated by ( ) and a group plane is indicated by { }. Additionally, a negative crystallographic index is usually expressed by putting "-" (bar) above a number, but in the present specification, a negative sign is put before a number.

[1] A silicon carbide semiconductor device according to an embodiment of the present disclosure includes a silicon carbide substrate having a first main surface and a second main surface opposite to the first main surface. The silicon carbide substrate includes a drift region being of a first conductivity type; a body region provided on the drift region, the body region being of a second conductivity type different from the first conductivity type; and a source region provided on the body region so as to be separated from the drift region, the source region being of the first conductivity type. A gate trench is provided on the first main surface. The gate trench is defined by side surfaces passing through the source region and the body region to reach the drift region and a bottom surface continuous with the side surfaces. The silicon carbide substrate further includes a first electric field relaxation region provided between the bottom surface and the second main surface, the first electric field relaxation region being of the second conductivity type. The first electric field relaxation region includes, in a direction perpendicular to the first main surface, a first plane in which a concentration of an impurity of the second conductivity type is a maximum value, and a second plane, in which a concentration of the impurity of the second conductivity type is $\frac{1}{10}$ of the maximum value, and the second plane is closer to the second main surface than the first plane is. A distance between the first plane and the second plane is 1.0 μm or greater, and a distance from the first main surface to an interface that is between the first electric field relaxation region and the drift region is 2.0 μm or greater.

In the first electric field relaxation region, a distance between the first plane in which a concentration of the impurity of the second conductivity type is a maximum value and the second plane in which a concentration of the impurity of the second conductivity type is $\frac{1}{10}$ of the maximum value is 1.0 μm or greater. Additionally, a distance from the first main surface to an interface that is between the first electric field relaxation region and the drift region is 2.0 μm or greater. Therefore, the source region, the body region, the drift region, and the first electric field relaxation region can be appropriately formed without forming the epitaxial layer multiple times. Additionally, because the concentration of the impurity of the second conductivity type gradually changes in the first electric field relaxation region, the breakdown voltage can be improved and the short-circuit current can be suppressed while suppressing the on-resistance.

[2] In [1], the first electric field relaxation region may further contain an impurity of the first conductivity type, and a total amount of the impurity of the second conductivity type contained in the first electric field relaxation region may be greater than a total amount of the impurity of the first conductivity type contained in the first electric field relaxation region. In this case, the first electric field relaxation region can be formed by ion implantation of the impurity of the second conductivity type into a region containing the impurity of the first conductivity type. By adjusting the concentration of the impurity of the first conductivity type and the concentration of the impurity of the second conductivity type, desired on-resistance, breakdown voltage, and short-circuit resistance can be obtained.

[3] In [1] or [2], a distance between the first main surface and the bottom surface may be less than 0.8 μm, and a distance between the first main surface and the first plane may be 0.8 μm or greater. In this case, it is easy to reduce the on-resistance in a region between the body region and the first electric field relaxation region.

[4] In [1] to [3], a maximum value of an effective concentration of the impurity of the second conductivity type in the body region may be $1.0 \times 10^{18}$ cm$^{-3}$ or greater and $5.0 \times 10^{18}$ cm$^{-3}$ or less. In this case, the threshold voltage is increased, thereby facilitating the improvement of the short-circuit resistance.

[5] In [1] to [4], a distance between the first main surface and the first plane may be 3.0 μm or less. In this case, the first electric field relaxation region is easily formed by ion implantation through the first main surface.

[6] In [1] to [5], an active region including the body region, the source region, and the first electric field relaxation region, and a termination region provided around the active region and including a second electric field relaxation region being of the second conductivity type may be included, the second electric field relaxation region may include, in the direction perpendicular to the first main surface, a third plane in which a concentration of the impurity of the second conductivity type is a maximum value and a fourth plane, in which a concentration of the impurity of the second conductivity type is $\frac{1}{10}$ of the maximum value, and the fourth plane is closer to the second main surface than the third plane is, and a distance between the third plane and the fourth plane may be 1.0 μm or greater. In this case, the breakdown voltage of the termination region is caused to be greater than the breakdown voltage of the active region, thereby facilitating the improvement of the avalanche resistance.

[7] In [6], the second electric field relaxation region may be electrically connected to the first electric field relaxation region. In this case, it is easy to control the first electric field relaxation region and the second electric field relaxation region to the same potential.

[8] In any one of [1] to [7], the side surfaces of the gate trench may include a {0-33-8} plane. When the side surfaces include the {0-33-8} plane, good mobility is obtained at the side surfaces of the gate trench, thereby reducing the channel resistance.

Embodiment of the Present Disclosure

Figure 2:
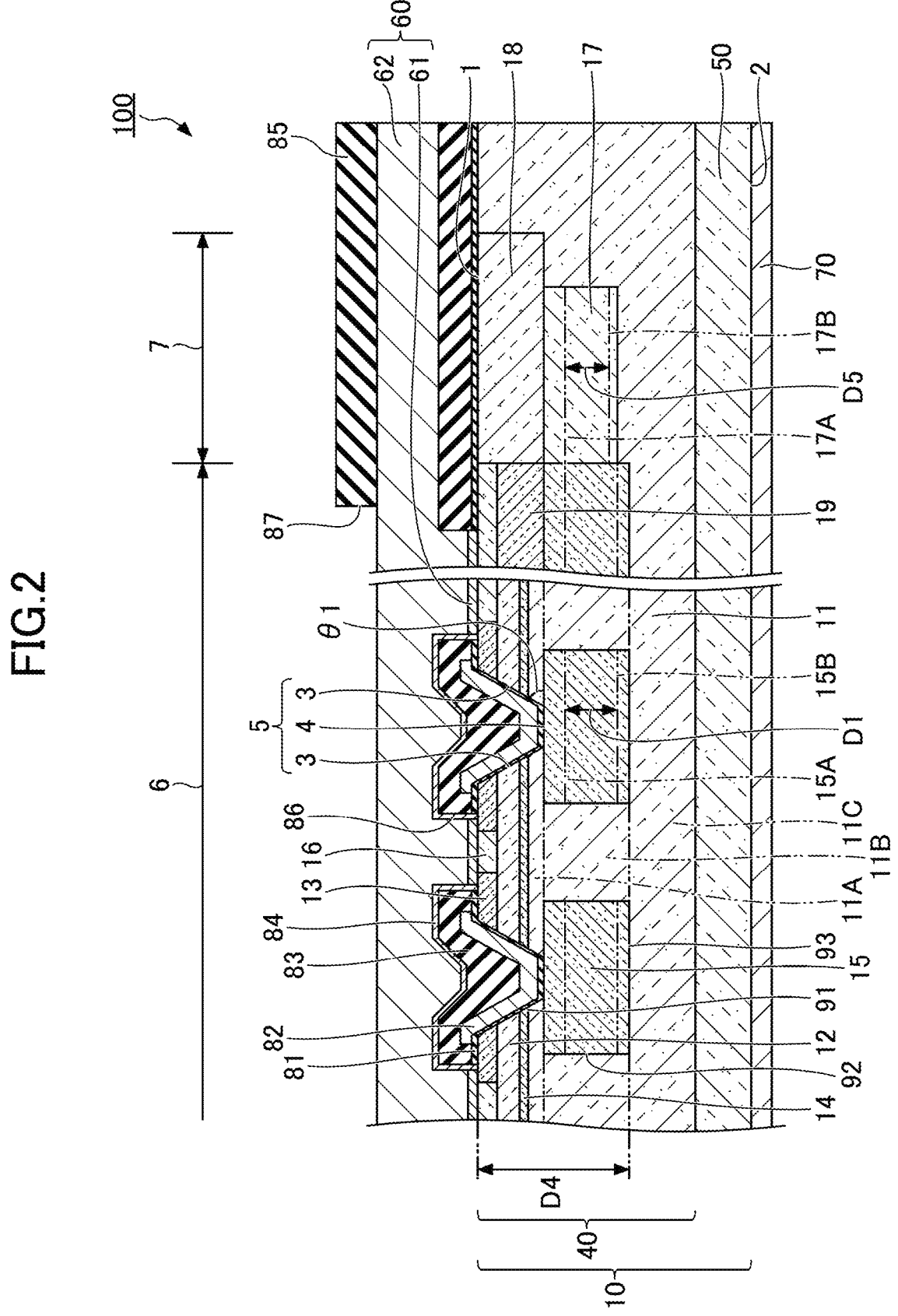
FIG. 2 is a cross-sectional view illustrating a configuration of the silicon carbide semiconductor device according to the embodiment.

An embodiment of the present disclosure relates to what is called a vertical MOSFET (a silicon carbide semiconductor device). FIG. 1 is a drawing illustrating a layout of a silicon carbide semiconductor device according to the embodiment. FIG. 2 is a cross-sectional view illustrating a configuration of the silicon carbide semiconductor device according to the embodiment. FIG. 2 corresponds to a cross-sectional view taken along the line II-II in FIG. 1.

As illustrated in FIG. 1 and FIG. 2, a MOSFET 100 according to the present embodiment mainly includes a silicon carbide substrate 10, a gate insulating film 81, a gate electrode 82, an interlayer insulating film 83, a source electrode 60, a drain electrode 70, a barrier metal film 84, and a passivation film 85. The silicon carbide substrate 10 includes a silicon carbide single-crystal substrate 50 and a silicon carbide epitaxial layer 40 on the silicon carbide single-crystal substrate 50. The silicon carbide substrate 10 has a first main surface 1 and a second main surface 2 opposite to the first main surface 1. The silicon carbide epitaxial layer 40 forms the first main surface 1, and the silicon carbide single-crystal substrate 50 forms the second main surface 2. The silicon carbide single-crystal substrate 50 and the silicon carbide epitaxial layer 40 are made of, for example, hexagonal silicon carbide of polytype 4H. The silicon carbide single-crystal substrate 50 contains an n-type impurity such as nitrogen (N) and has an n-type conductivity type (a first conductivity type).

The first main surface 1 is a {0001} plane or a plane inclined from the {0001} plane by an off angle of 8° or less in the off direction. Preferably, the first main surface 1 is a (000-1) plane or a plane inclined from the (000-1) plane by an off angle of 8° or less in the off direction. The off direction may be, for example, the <11-20> direction or the <1-100> direction. The off angle may be, for example, 1° or greater, or 2° or greater. The off angle may be 6° or less, or may be 4° or less.

The MOSFET 100 has an active region 6 and a termination region 7 provided around the active region 6 in plan view in a direction perpendicular to the first main surface 1.

The silicon carbide epitaxial layer 40 mainly includes a drift region 11, a body region 12, a source region 13, a current diffusion region 14, an electric field relaxation region 15, a connection region 19, a contact region 16, a buried junction termination extension (JTE) region 17, and a surface JTE region 18. The body region 12, the source region 13, the current diffusion region 14, the electric field relaxation region 15, the contact region 16, and the connection region 19 are provided in the active region 6. The buried JTE region 17 and the surface JTE region 18 are provided in the termination region 7. The drift region 11 extends for the length of the active region 6 and the termination region 7.

The drift region 11 contains an n-type impurity such as nitrogen or phosphorus (P) and has the n-type conductivity. The drift region 11 mainly includes, for example, a first region 11A, a second region 11B, and a third region 11C.

The current diffusion region 14 is provided on the drift region 11. The current diffusion region 14 contains an n-type impurity such as phosphorus and has the n-type conductivity. The current diffusion region 14 is located between the body region 12 and the first region 11A in a direction perpendicular to the second main surface 2. The current diffusion region 14 is in contact with the body region 12 and the first region 11A. The current diffusion region 14 is located closer to the second main surface 2 than the body region 12 is. The current diffusion region 14 is located closer to the first main surface 1 than the first region 11A is. The current diffusion region 14 is also in contact with a side surface 3. A peak value of the effective concentration of the n-type impurity in the current diffusion region 14 is preferably $5 \times 10^{17}$ cm$^{-3}$ or less in order to suppress the short-circuit current. The peak value of the effective concentration of the n-type impurity in the current diffusion region 14 is preferably $2 \times 10^{17}$ cm$^{-3}$ or greater in order to suppress the on-resistance. The current diffusion region 14 forms a portion of the drift region.

The body region 12 is provided on the current diffusion region 14. The body region 12 contains a p-type impurity such as aluminum (Al) and has a p-type conductivity type (a second conductivity type). The body region 12 is located between the source region 13 and the current diffusion region 14 in the direction perpendicular to the second main surface 2. The body region 12 is in contact with the source region 13 and the current diffusion region 14. The body region 12 is located closer to the second main surface 2 than the source region 13 is. The body region 12 is located closer to the first main surface 1 than the current diffusion region 14 is. The body region 12 is also in contact with the side surface 3. The effective concentration of the p-type impurity in the body region 12 is, for example, $5 \times 10^{17}$ cm$^{-3}$ or greater and $5 \times 10^{18}$ cm$^{-3}$ or less. The maximum value of the effective concentration of the p-type impurity in the body region 12 is preferably $1.0 \times 10^{18}$ cm$^{-3}$ or greater and $5.0 \times 10^{18}$ cm$^{-3}$ or less. The short channel effect (punch-through) may occur when a depletion layer spreads from the pn junction region into the channel region and the entire channel region becomes the depletion layer. By increasing the effective concentration of the p-type impurity in the body region 12, the spread of the depletion layer formed in the channel region can be reduced. This increases the threshold voltage, thereby facilitating the improvement of the short-circuit resistance.

The source region 13 is located on the body region 12 in the direction perpendicular to the second main surface 2. The source region 13 is in contact with the body region 12. The source region 13 is provided on the body region 12 so as to be separated from the current diffusion region 14 by the body region 12. The source region 13 is located closer to the first main surface 1 than the body region 12 is. The source region 13 is also in contact with the side surface 3. The source region 13 is covered by the gate insulating film 81. The source region 13 is in direct contact with the gate insulating film 81. The source region 13 contains an n-type impurity such as nitrogen or phosphorus and has the n-type conductivity type. The source region 13 forms the first main surface 1. The effective concentration of the n-type impurity in the source region 13 is, for example, $5 \times 10^{16}$ cm$^{-3}$ or greater and $5 \times 10^{19}$ cm$^{-3}$ or less. The effective concentration of the n-type impurity in the source region 13 at the first main surface 1 is preferably $1 \times 10^{15}$ cm$^{-3}$ or greater in order to reduce the sheet resistance.

The contact region 16 contains a p-type impurity such as aluminum and has the p-type conductivity. The effective concentration of the p-type impurity in the contact region 16 is greater than the effective concentration of the p-type impurity in the body region 12, for example. The contact region 16 passes through the source region 13 and is in contact with the body region 12. The contact region 16 forms the first main surface 1. The effective concentration of the p-type impurity in the contact region 16 is, for example, $1 \times 10^{18}$ cm$^{-3}$ or greater and $1 \times 10^{20}$ cm$^{-3}$ or less.

A gate trench 5 defined by the side surfaces 3 and a bottom surface 4 is provided in the first main surface 1. The side surfaces 3 pass through the source region 13, the body region 12, the current diffusion region 14, and the drift region 11 to reach the electric field relaxation region 15. The bottom surface 4 is continuous with the side surfaces 3. The bottom surface 4 is positioned at the electric field relaxation region 15. The bottom surface 4 is, for example, a plane parallel to the second main surface 2. An angle θ1 of the side surface 3 with respect to a plane including the bottom surface 4 is, for example, 45° or greater and 65° or less. The angle θ1 may be, for example, 50° or greater. The angle θ1 may be, for example, 60° or less. The side surfaces 3 preferably include a {0-33-8} plane. The {0-33-8} plane is a crystal plane from which excellent mobility is obtained. The gate trench 5 extends in a stripe shape along a first direction parallel to the first main surface 1, for example. In plan view in the direction perpendicular to the first main surface 1, multiple gate trenches 5 are provided at regular intervals in a second direction perpendicular to the first direction. Multiple gate trenches 5 may be provided, for example, in an array.

The electric field relaxation region 15 contains a p-type impurity such as aluminum and has the p-type conductivity type. The electric field relaxation region 15 may further contain an n-type impurity such as nitrogen or phosphorus. The total amount of the p-type impurity contained in the electric field relaxation region 15 is greater than the total amount of the n-type impurity contained in the electric field relaxation region 15. The electric field relaxation region 15 is located between the current diffusion region 14 and the second main surface 2. In plan view in the direction perpendicular to the first main surface 1, the electric field relaxation region 15 includes a portion overlapping the gate trench 5. For example, the electric field relaxation region 15 is located between the bottom surface 4 of the gate trench 5 and the second main surface 2, and an upper end surface of the electric field relaxation region 15 includes, for example, the bottom surface 4 of the gate trench 5. A portion of the upper end surface of the electric field relaxation region 15 faces a portion of a lower end surface of the current diffusion region 14. In plan view in the direction perpendicular to the first main surface 1, the electric field relaxation region 15 has a side end surface 92 that is spaced farther apart from the gate trench 5 than a first position 91 being a position at which the current diffusion region 14, the body region 12, and the side surface 3 are in contact with each other. The electric field relaxation region 15 may be electrically connected to the source electrode 60. The effective concentration of the p-type impurity in the electric field relaxation region 15 is, for example, $5\times10^{17}\,\mathrm{cm}^{-3}$ or greater and $5\times10^{18}$ $\mathrm{cm}^{-3}$ or less.

Figure 3:
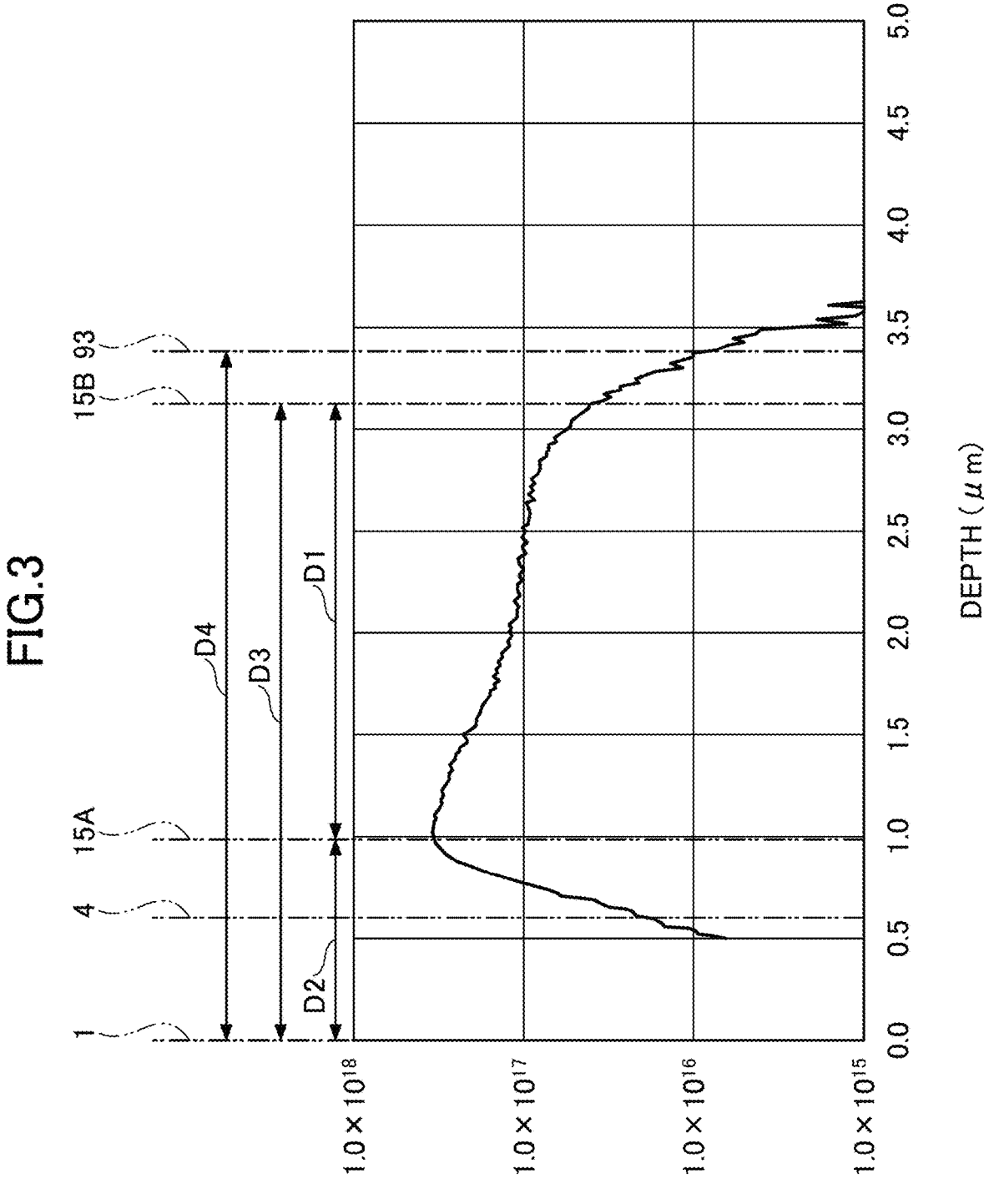
FIG. 3 is a graph illustrating an example of a concentration profile of a p-type impurity in an electric field relaxation region in the embodiment.

FIG. 3 is a graph illustrating an example of a concentration profile of the p-type impurity in the electric field relaxation region 15. In FIG. 3, the horizontal axis represents the distance from the first main surface 1, and the vertical axis represents the concentration of the p-type impurity. In the direction perpendicular to the first main surface 1, the electric field relaxation region 15 has a first plane 15A in which the concentration of the p-type impurity is the maximum value, and a second plane 15B, in which the concentration of the p-type impurity is $\frac{1}{10}$ of the maximum value, and the second plane 15B is closer to the second main surface 2 than the first plane 15A is. For example, the concentration of the p-type impurity in the first plane 15A is $3.4\times10^{17}\,\mathrm{cm}^{-3}$, and the concentration of the p-type impurity in the second plane 15B is $3.4\times10^{16}\,\mathrm{cm}^{-3}$. A distance D1 between the first plane 15A and the second plane 15B is 1.0 μm or greater. For example, a distance D2 between the first main surface 1 and the first plane 15A is about 1.0 μm, a distance D3 between the first main surface 1 and the second plane 15B is about 3.2 μm, and the distance D1 between the first plane 15A and the second plane 15B is about 2.2 μm. The electric field relaxation region 15 is an example of a first electric field relaxation region.

The connection region 19 contains a p-type impurity such as aluminum and has the p-type conductivity type. In plan view in the direction perpendicular to the first main surface 1, the connection region 19 is provided in the vicinity of a boundary between the active region 6 and the termination region 7, and has an annular planar shape. The connection region 19 is provided on the electric field relaxation region 15 on the first main surface 1 side. A lower end surface of the connection region 19 is in contact with the upper end surface of the electric field relaxation region 15. The contact region 16 is also formed on the connection region 19. An upper end surface of the connection region 19 is in contact with a lower end surface of the contact region 16.

The first region 11A of the drift region 11 is located between the current diffusion region 14 and the electric field relaxation region 15. The first region 11A is in contact with the current diffusion region 14 and the electric field relaxation region 15. The first region 11A is located closer to the second main surface 2 than the current diffusion region 14 is. The first region 11A is located closer to the first main surface 1 than the electric field relaxation region 15 is. The effective concentration of the n-type impurity in the first region 11A is, for example, $5\times10^{15}\,\mathrm{cm}^{-3}$ or greater and $5\times10^{16}\,\mathrm{cm}^{-3}$ or less.

The second region 11B is located closer to the second main surface 2 than the first region 11A is. The second region 11B is continuous with the first region 11A. The second region 11B is in contact with the electric field relaxation region 15 in a direction parallel to the second main surface 2. The second region 11B and the electric field relaxation region 15 may be located on the same plane parallel to the second main surface 2. The effective concentration of the n-type impurity in the second region 11B may be greater than the effective concentration of the n-type impurity in the first region 11A. The effective concentration of the n-type impurity in the second region 11B is, for example, $5\times10^{15}\,\mathrm{cm}^{-3}$ or greater and $5\times10^{16}\,\mathrm{cm}^{-3}$ or less.

The third region 11C is located closer to the second main surface 2 than the second region 11B is. The third region 11C is continuous with the second region 11B. The third region 11C is in contact with the electric field relaxation region 15. The third region 11C is located closer to the second main surface 2 than the electric field relaxation region 15 is. The third region 11C may be located between the second region 11B and the silicon carbide single-crystal substrate 50. The third region 11C may be continuous with the silicon carbide single-crystal substrate 50. The effective concentration of the n-type impurity in the third region 11C is, for example, $5\times 10^{15}\,\mathrm{cm}^{-3}$ or greater and $5\times10^{16}\,\mathrm{cm}^{-3}$ or less.

A lower end surface of the electric field relaxation region 15 is in contact with an upper end surface of the third region 11C of the drift region 11. A distance D4 from the first main surface 1 to an interface 93 (see FIG. 2) that is between the electric field relaxation region 15 and the drift region 11 is 2.0 μm or greater (see FIG. 3). At the interface 93, the concentration of the p-type impurity is equal to the concentration of the n-type impurity; in the electric field relaxation region 15, the concentration of the p-type impurity is greater than the concentration of the n-type impurity; and in the third region 11C, the concentration of the p-type impurity is less than the concentration of the n-type impurity. For example, the concentration of the n-type impurity in the electric field relaxation region 15 and the drift region 11 is $1.00\times 10^{16}\,\mathrm{cm}^{-3}$, the concentration of the p-type impurity in the electric field relaxation region 15 is greater than $1.00\times 10^{16}\,\mathrm{cm}^{-3}$, and the concentration of the p-type impurity in the drift region 11 is less than $1.00\times10^{16}\,\mathrm{cm}^{-3}$.

The buried JTE region 17 contains a p-type impurity such as aluminum and has the p-type conductivity type. The concentration of the p-type impurity in the buried JTE region 17 may be less than the concentration of the p-type impurity in the electric field relaxation region 15. The buried JTE region 17 may further contain an n-type impurity such as nitrogen or phosphorus. The total amount of the p-type impurity contained in the buried JTE region 17 is greater than the total amount of the n-type impurity contained in the buried JTE region 17. The buried JTE region 17 is provided on the drift region 11. The buried JTE region 17 is in contact with the electric field relaxation region 15 in a direction parallel to the first main surface 1. The buried JTE region 17 is an example of a second electric field relaxation region.

In the direction perpendicular to the first main surface 1, the buried JTE region 17 has a third plane 17A in which the concentration of the p-type impurity is the maximum value, and a fourth plane 17B, in which the concentration of the p-type impurity is $\frac{1}{10}$ of the maximum value, and the fourth plane is closer to the second main surface 2 than third plane 17A is. Additionally, a distance D5 between the third plane 17A and the fourth plane 17B is 1.0 μm or greater.

The surface JTE region 18 contains a p-type impurity such as aluminum and has the p-type conductivity type. The surface JTE region 18 is provided on the buried JTE region 17. An end of the surface JTE region 18 on the side opposite to the active region 6 is spaced farther apart from the active region 6 than an end of the buried JTE region 17 on the side opposite to the active region 6 is. The effective concentration of the p-type impurity in the surface JTE region 18 may be, for example, substantially the same as the effective concentration of the p-type impurity in the buried JTE region 17. The surface JTE region 18 is in contact with the contact region 16 and the connection region 19 in the direction parallel to the first main surface 1. The surface JTE region 18 forms the first main surface 1.

The gate insulating film 81 is, for example, an oxide film. The gate insulating film 81 is made of, for example, a material containing silicon dioxide. The gate insulating film 81 is in contact with the side surfaces 3 and the bottom surface 4. The gate insulating film 81 is in contact with the electric field relaxation region 15 at the bottom surface 4. The gate insulating film 81 is in contact with each of the source region 13, the body region 12, the current diffusion region 14, and the first region 11A at the side surface 3. The gate insulating film 81 may be in contact with the source region 13 at the first main surface 1.

The gate electrode 82 is provided on the gate insulating film 81. The gate electrode 82 is made of, for example, polysilicon (poly-Si) containing a conductive impurity. The gate electrode 82 is disposed inside the gate trench 5. A portion of the gate electrode 82 may be disposed on the first main surface 1.

The interlayer insulating film 83 is provided in contact with the gate electrode 82 and the gate insulating film 81. The interlayer insulating film 83 is made of, for example, a material containing silicon dioxide. The interlayer insulating film 83 electrically insulates the gate electrode 82 from the source electrode 60. A portion of the interlayer insulating film 83 may be provided inside the gate trench 5.

Contact holes 86 are formed in the interlayer insulating film 83 and the gate insulating film 81 at regular intervals in the second direction. The contact holes 86 are provided such that the gate trench 5 is positioned between the contact holes 86 adjacent to each other in the second direction, in plan view in the direction perpendicular to the first main surface 1. The contact hole 86 extends in the first direction. The source region 13 and the contact region 16 are exposed from the interlayer insulating film 83 and the gate insulating film 81 through the contact hole 86. The contact region 16 does not need to be disposed over an entirety in the first direction (the longitudinal direction of the gate trench 5) and may be disposed periodically.

The barrier metal film 84 covers an upper surface and side surfaces of the interlayer insulating film 83 and side surfaces of the gate insulating film 81. The barrier metal film 84 is in contact with each of the interlayer insulating film 83 and the gate insulating film 81. The barrier metal film 84 is made of, for example, a material containing titanium nitride (TiN).

The source electrode 60 is in contact with the first main surface 1. The source electrode 60 includes a contact electrode 61 and a source interconnect 62. The contact electrode 61 may be in contact with the source region 13 and the contact region 16 at the first main surface 1. The contact electrode 61 is made of, for example, a material containing nickel silicide (NiSi). The contact electrode 61 may be made of a material containing titanium, aluminum, and silicon. The contact electrode 61 is in ohmic contact with the contact region 16. The source interconnect 62 covers an upper surface and side surfaces of the barrier metal film 84 and an upper surface of the contact electrode 61. The source interconnect 62 is in contact with each of the barrier metal film 84 and the contact electrode 61. The source interconnect 62 is made of, for example, a material containing aluminum.

The passivation film 85 covers an upper surface of the source interconnect 62. The passivation film 85 is in contact with the source interconnect 62. The passivation film 85 is made of, for example, a material containing polyimide. An opening 87 that exposes a portion of the upper surface of the source interconnect 62 is formed in the passivation film 85.

The drain electrode 70 is in contact with the second main surface 2. The drain electrode 70 is in contact with the silicon carbide single-crystal substrate 50 at the second main surface 2. The drain electrode 70 is electrically connected to the drift region 11. The drain electrode 70 is made of, for example, a material containing nickel silicide. The drain electrode 70 may be made of a material containing titanium, aluminum, and silicon. The drain electrode 70 is in ohmic contact with the silicon carbide single-crystal substrate 50.

In the direction perpendicular to the second main surface 2, the upper end surface of the electric field relaxation region 15 may be spaced apart from the bottom surface 4. In this case, for example, the bottom surface 4 may be positioned in the drift region 11, and the side surfaces 3 may pass through the source region 13, the body region 12, and the current diffusion region 14 to reach the drift region 11. For example, the first region 11A may be located between the upper end surface of the electric field relaxation region 15 and the bottom surface 4.

Between the silicon carbide single-crystal substrate 50 and the third region 11C, a buffer layer containing an n-type impurity such as nitride and being of the n-type conductivity may be provided. The effective concentration of the n-type impurity in the buffer layer may be greater than the effective concentration of the n-type impurity in the third region 11C.

In the present disclosure, the effective concentration of the p-type impurity is a difference between the concentration of the p-type impurity and the concentration of the n-type impurity, and the effective concentration of the n-type impurity is a difference between the concentration of the n-type impurity and the concentration of the p-type impurity. The effective concentration can be measured by, for example, the following steps 1 to 4.

(Step 1) An element region is determined by observing a surface of a semiconductor device.

(Step 2) The semiconductor device is processed so that the cross section of the semiconductor region illustrated in FIG. 2 appears. For example, cross section processing of the semiconductor device is performed using a focused ion beam (FIB) device.

(Step 3) It is determined whether the conductivity type of the region, into which the impurity is implanted, is p-type or n-type, by using a scanning electron microscope (SEM). For example, when SEM observation is performed under the conditions of 3 kV acceleration voltage and 10,000 times magnification, a bright region indicates a p-type region, and a dark region indicates an n-type region.

(Step 4) With respect to the p-type region and the n-type region in the cross section described above, the impurity concentrations are measured using a scanning spreading resistance microscopy (SSRM). The concentration of the p-type region is the effective concentration of the p-type impurity, and the concentration of the n-type region is the effective concentration of the n-type impurity.

Next, a method of manufacturing the MOSFET 100 according to the embodiment will be described. FIGS. 4 to 12 are cross-sectional views illustrating the method of manufacturing the MOSFET 100 according to the embodiment. FIGS. 4 to 12 correspond to cross-sectional views taken along the line II-II in FIG. 1, as in FIG. 2.

Figure 4:
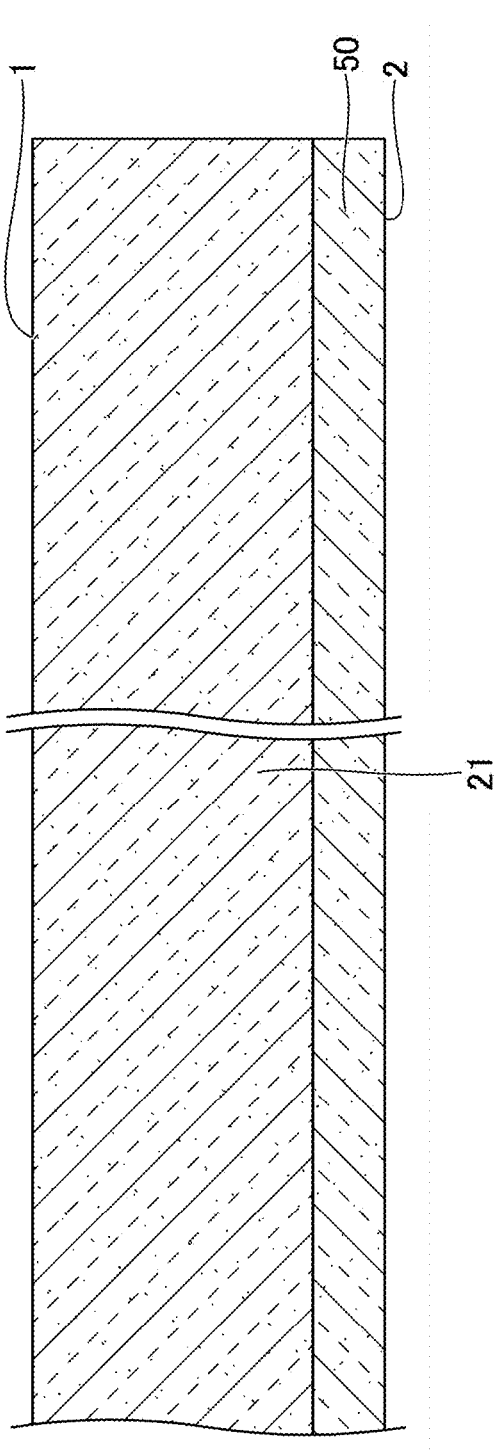
FIG. 4 is a cross-sectional view (part 1) illustrating a method for manufacturing the silicon carbide semiconductor device according to the embodiment.

First, as illustrated in FIG. 4, the silicon carbide single-crystal substrate 50 is prepared. For example, a silicon carbide ingot (not illustrated) manufactured by a sublimation method is sliced to prepare the silicon carbide single-crystal substrate 50. A buffer layer (not illustrated) may be formed on the silicon carbide single-crystal substrate 50. The buffer layer can be formed by a chemical vapor deposition (CVD) method using, for example, a mixture gas of silane ($SiH_4$) and propane ($C_3H_8$) as a source gas and using, for example, hydrogen gas ($H_2$) as a carrier gas. During the epitaxial growth of the buffer layer, an n-type impurity such as nitrogen may be introduced into the buffer layer.

Next, as also illustrated in FIG. 4, an epitaxial layer 21 is formed. The epitaxial layer 21 is formed on the silicon carbide single-crystal substrate 50 by a CVD method using, for example, a mixture gas of silane and propane as a source gas and using, for example, hydrogen as a carrier gas. During the epitaxial growth, an n-type impurity such as nitrogen is introduced into the epitaxial layer 21. The epitaxial layer 21 has the n-type conductivity. The effective concentration of the n-type impurity in the epitaxial layer 21 may be less than the effective concentration of the n-type impurity in the buffer layer.

Figure 5:
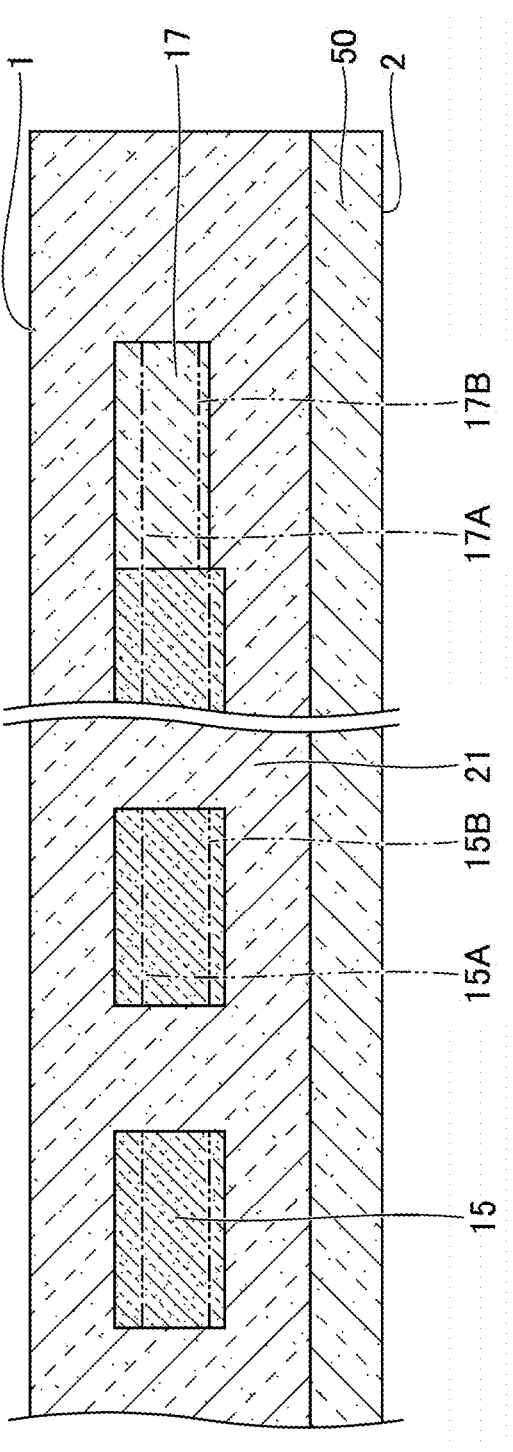
FIG. 5 is a cross-sectional view (part 2) illustrating the method for manufacturing the silicon carbide semiconductor device according to the embodiment.

Next, as illustrated in FIG. 5, the electric field relaxation region 15 is formed. For example, a mask layer (not illustrated), having an opening on a region where the electric field relaxation region 15 is to be formed, is formed. Next, p-type impurity ions, such as aluminum ions, capable of imparting a p-type are implanted into the epitaxial layer 21. The implantation of the p-type impurity ions is performed under a condition in which a channeling phenomenon occurs. This forms the electric field relaxation region 15 having the first plane 15A and the second plane 15B. For example, the implantation energy of the p-type impurity ions at the time of forming the electric field relaxation region 15 may be 900 kev or greater and 1,000 keV or less, and the dose amount may be $3.5 \times 10^{13}$ $cm^{-2}$ or greater and $4.5 \times 10^{13}$ $cm^{-2}$ or less. After the electric field relaxation region 15 is formed, the mask layer is removed.

Next, as also illustrated in FIG. 5, the buried JTE region 17 is formed. For example, a mask layer (not illustrated), having an opening on a region where the buried JTE region 17 is to be formed, is formed. Next, p-type impurity ions, such as aluminum ions, capable of imparting a p-type are implanted into the epitaxial layer 21. The implantation of the p-type impurity ions is performed under a condition in which a channeling phenomenon occurs. This forms the buried JTE region 17 having the third plane 17A and the fourth plane 17B. For example, the implantation energy of the p-type impurity ions at the time of forming the buried JTE region 17 may be 900 keV or greater and 1,000 keV or less, and the dose amount may be $0.5 \times 10^{13}$ $cm^{-2}$ or greater and $1.5 \times 10^{13}$ $cm^{-2}$ or less. After the buried JTE region 17 is formed, the mask layer is removed.

Figure 6:
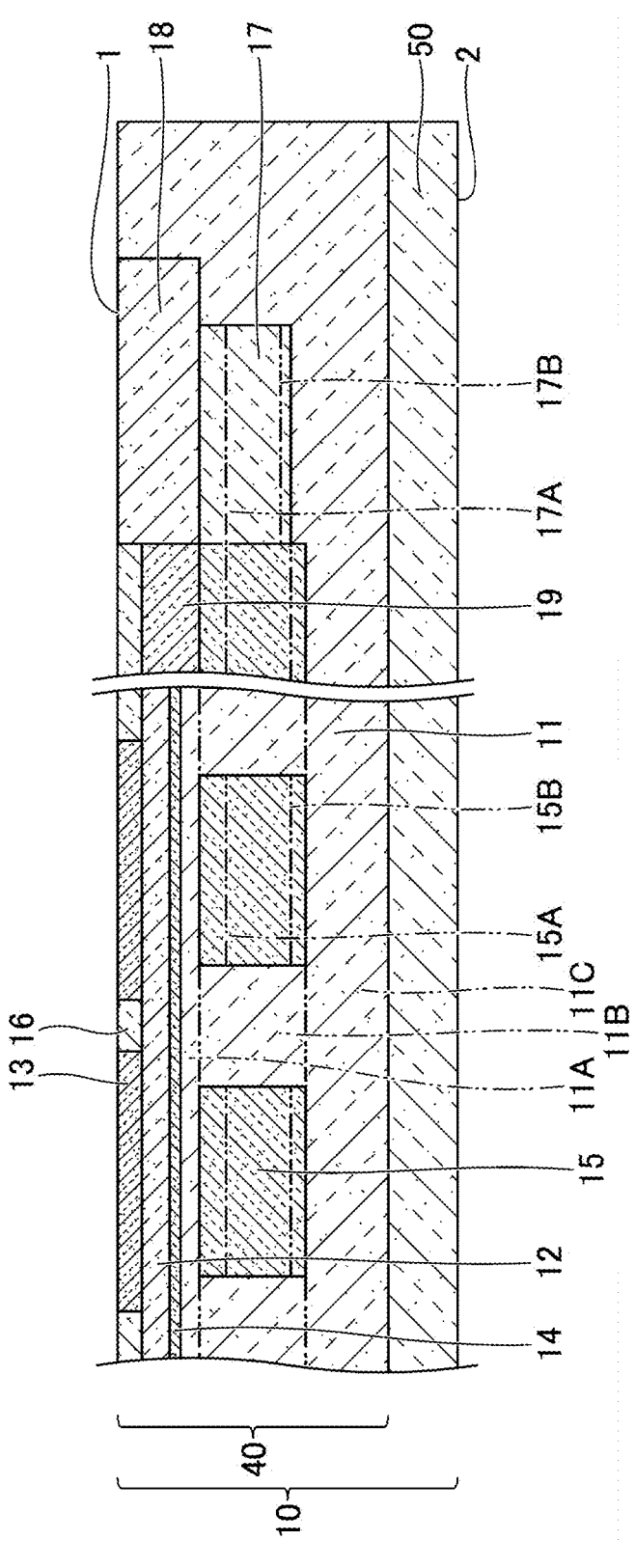
FIG. 6 is a cross-sectional view (part 3) illustrating the method for manufacturing the silicon carbide semiconductor device according to the embodiment.

Next, as illustrated in FIG. 6, the connection region 19 is formed. For example, a mask layer (not illustrated), having an opening on a region where the connection region 19 is to be formed, is formed. Next, p-type impurity ions, such as aluminum ions, capable of imparting a p-type are implanted into the epitaxial layer 21. This forms the connection region 19. After the connection region 19 is formed, the mask layer is removed. Next, as also illustrated in FIG. 6, the body region 12 is formed. For example, a mask layer (not illustrated), having an opening on a region where the body region 12 is to be formed, is formed. Next, p-type impurity ions, such as aluminum ions, capable of imparting a p-type are implanted into the epitaxial layer 21. This forms the body region 12.

Next, as also illustrated in FIG. 6, the current diffusion region 14 is formed. N-type impurity ions, such as phosphorus ions, capable of imparting an n-type are implanted into the epitaxial layer 21. This forms the current diffusion region 14.

Next, as also illustrated in FIG. 6, the source region 13 is formed. N-type impurity ions, such as phosphorus ions, capable of imparting an n-type are implanted into the epitaxial layer 21. This forms the source region 13. After the source region 13 is formed, the mask layer is removed.

Next, as also illustrated in FIG. 6, the contact region 16 is formed. For example, a mask layer (not illustrated), having an opening on a region where the contact region 16 is to be formed, is formed. Next, a p-type impurity, such as aluminum ions, capable of imparting a p-type is implanted into the epitaxial layer 21. This forms the contact region 16.

Next, as also illustrated in FIG. 6, the surface JTE region 18 is formed. For example, a mask layer (not illustrated), having an opening on a region where the surface JTE region 18 is to be formed, is formed. Next, a p-type impurity, such as aluminum ions, capable of imparting a p-type is implanted into the epitaxial layer 21. This forms the surface JTE region 18.

Next, activation annealing is performed to activate the impurity ions implanted into the silicon carbide substrate 10. The temperature of the activation annealing is preferably 1,500° C. or greater and 1,900° ° C. or less, and is for example, about 1,700° C. The activation annealing time is, for example, about 30 minutes. The atmosphere of the activation annealing is preferably an inert gas atmosphere, and is, for example, an argon (Ar) atmosphere.

Figure 7:
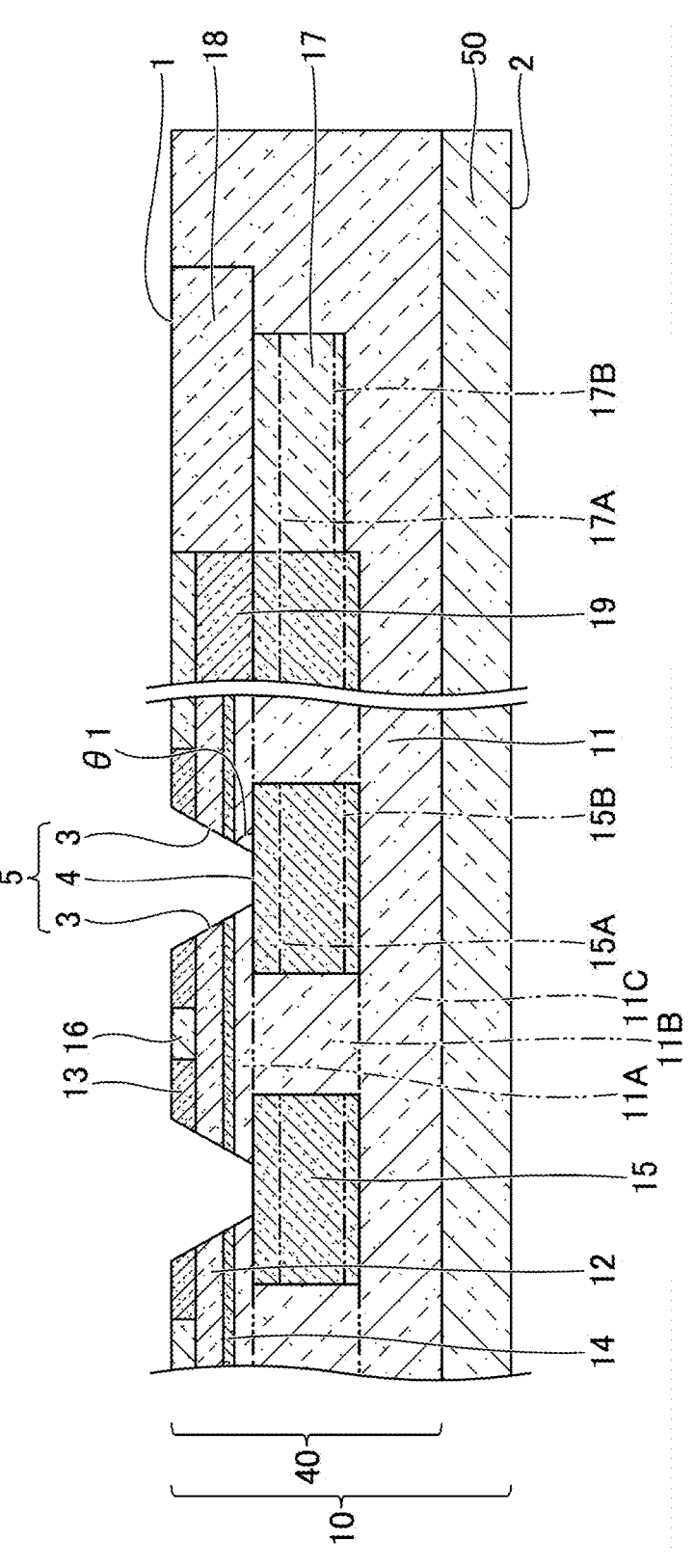
FIG. 7 is a cross-sectional view (part 4) illustrating the method for manufacturing the silicon carbide semiconductor device according to the embodiment.

Next, as illustrated in FIG. 7, the gate trench 5 is formed. For example, on the first main surface 1, a mask layer (not illustrated), having an opening on a position where the gate trench 5 is to be formed, is formed. Using the mask layer, a portion of the source region 13, a portion of the body region 12, a portion of the current diffusion region 14, and a portion of the drift region 11 are removed by etching. As the etching method, for example, reactive ion etching, particularly inductively coupled plasma reactive ion etching can be used. Specifically, inductively coupled plasma reactive ion etching using sulfur hexafluoride ($SF_6$) or a mixture gas of $SF_6$ and oxygen ($O_2$) as a reactive gas can be used. By etching, in a region where the gate trench 5 is to be formed, a recess (not illustrated) having a side portion substantially perpendicular to the first main surface 1 and a bottom portion provided continuously with the side portion and substantially parallel to the first main surface 1 is formed.

Next, thermal etching is performed in the recess. The thermal etching can be performed, for example, by heating in an atmosphere containing a reactive gas having at least one or more kinds of halogen atoms in a state where the mask layer is formed on the first main surface 1. The at least one or more kinds of halogen atom includes at least either a chlorine (Cl) atom or a fluorine (F) atom. The atmosphere includes, for example, chloride ($Cl_2$), boron trichloride ($BCl_3$), $SF_6$, or tetrafluoromethane ($CF_4$). For example, a mixture gas of chlorine gas and oxygen gas is used as a reactive gas, and thermal etching is performed at a heat treatment temperature of, for example, 800° ° C. or greater and 900° C. or less. Here, the reactive gas may include a carrier gas in addition to the chlorine gas and the oxygen gas described above. As the carrier gas, for example, nitrogen gas, argon gas, helium gas, or the like can be used.

By the thermal etching described above, the gate trench 5 is formed in the first main surface 1 of the silicon carbide substrate 10. The gate trench 5 is defined by the side surfaces 3 and the bottom surface 4. The side surfaces 3 are formed by the source region 13, the body region 12, the current diffusion region 14, and the drift region 11. The bottom surface 4 is formed by the electric field relaxation region 15. An angle θ1 between the side surface 3 and a plane including the bottom surface 4 is 45° or greater and 65° or less, for example. Next, the mask layer is removed from the first main surface 1.

Figure 8:
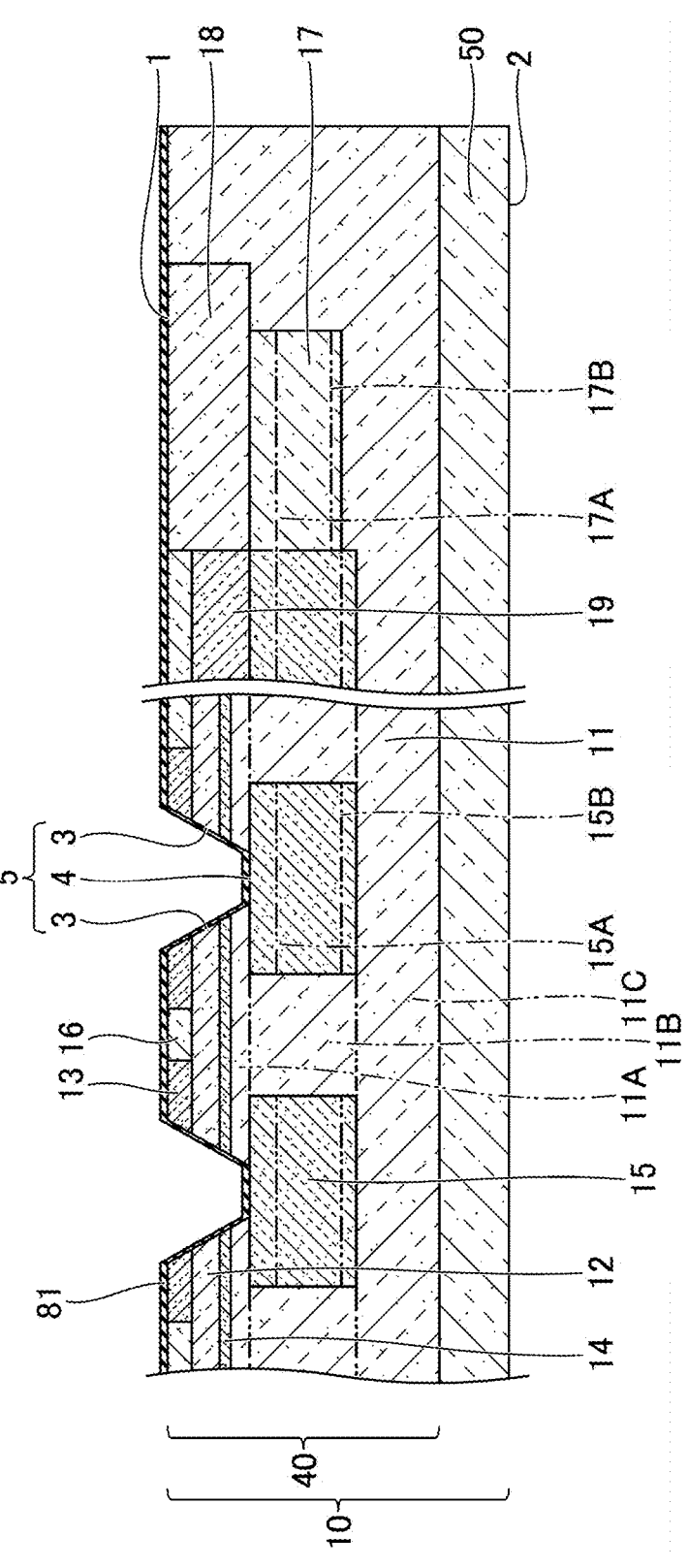
FIG. 8 is a cross-sectional view (part 5) illustrating the method for manufacturing the silicon carbide semiconductor device according to the embodiment.

Next, as illustrated in FIG. 8, the gate insulating film 81 is formed. For example, the silicon carbide substrate 10 is thermally oxidized to form the gate insulating film 81 that is in contact with the source region 13, the body region 12, the current diffusion region 14, the drift region 11, the electric field relaxation region 15, and the contact region 16. Specifically, the silicon carbide substrate 10 is heated at a temperature of, for example, 1, 300° C. or greater and 1, 400° C. or less in an atmosphere containing oxygen. This forms the gate insulating film 81 that is in contact with the first main surface 1, the side surface 3, and the bottom surface 4. Here, when the gate insulating film 81 is formed by thermal oxidation, strictly speaking, a portion of the silicon carbide substrate 10 is taken into the gate insulating film 81. Therefore, in the subsequent processing, it is assumed that the first main surface 1, the side surface 3, and the bottom surface 4 have slightly moved to the interface that is between the gate insulating film 81 and the silicon carbide substrate 10 that have been thermally oxidized.

Next, in a nitrogen monoxide (NO) gas atmosphere, heat treatment (NO annealing) may be performed on the silicon carbide substrate 10. In the NO annealing, the silicon carbide substrate 10 is held for about one hour under a condition of, for example, 1,100° C. or greater and 1,400° C. or less. This causes nitrogen atoms to be introduced into the interface region between the gate insulating film 81 and the body region 12. As a result, formation of an interface state at the interface region is suppressed, thereby improving the channel mobility.

After the NO annealing, Ar annealing using argon (Ar) as an atmospheric gas may be performed. The heating temperature of the Ar annealing is, for example, greater than or equal to the heating temperature of the NO annealing. The time of the Ar annealing is, for example, about one hour. This further suppresses formation of an interface state in the interface region between the gate insulating film 81 and the body region 12. Here, as the atmospheric gas, another inert gas such as nitrogen gas may be used instead of the Ar gas.

Figure 9:
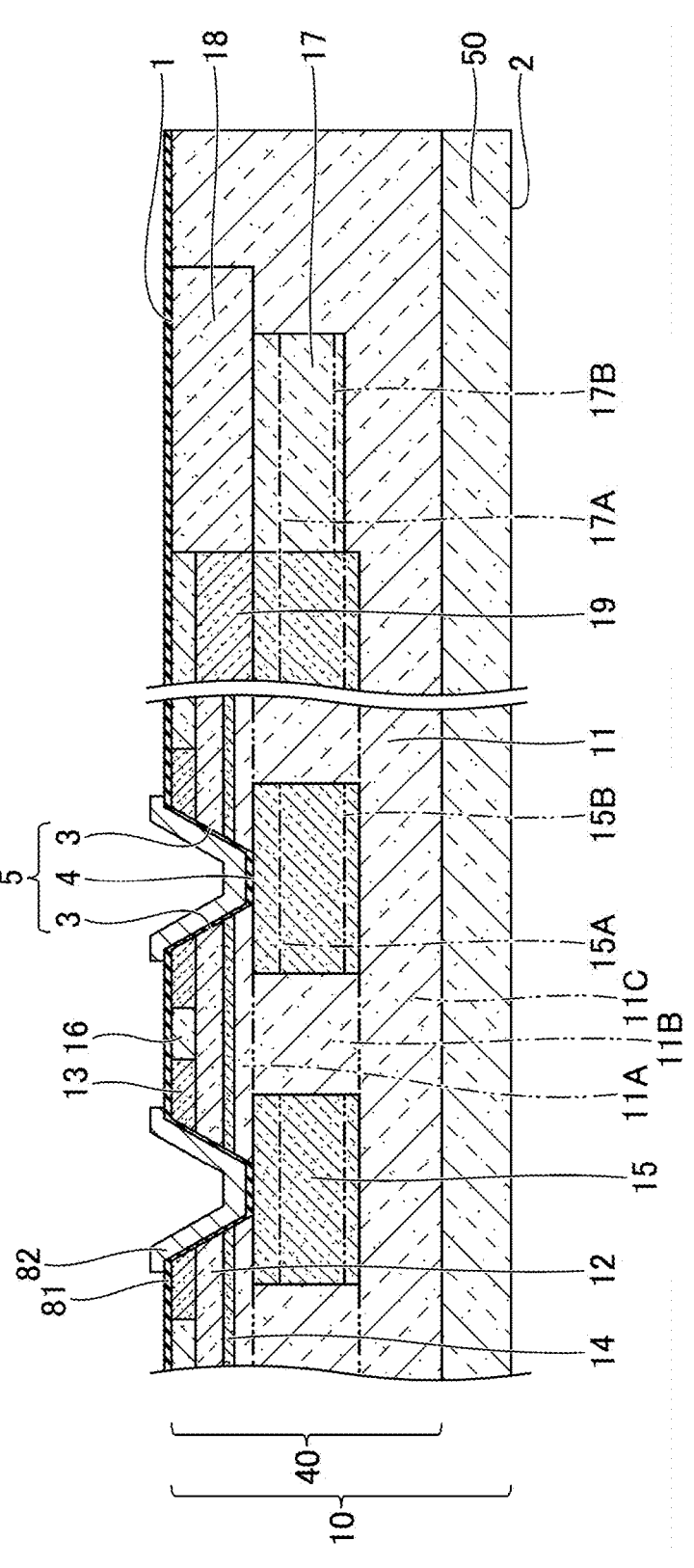
FIG. 9 is a cross-sectional view (part 6) illustrating the method for manufacturing the silicon carbide semiconductor device according to the embodiment.

Next, as illustrated in FIG. 9, the gate electrode 82 is formed. The gate electrode 82 is formed on the gate insulating film 81. The gate electrode 82 is formed by, for example, a low pressure-chemical vapor deposition (LP-CVD) method. The gate electrode 82 is formed to face each of the source region 13, the body region 12, the current diffusion region 14, and the drift region 11.

Figure 10:
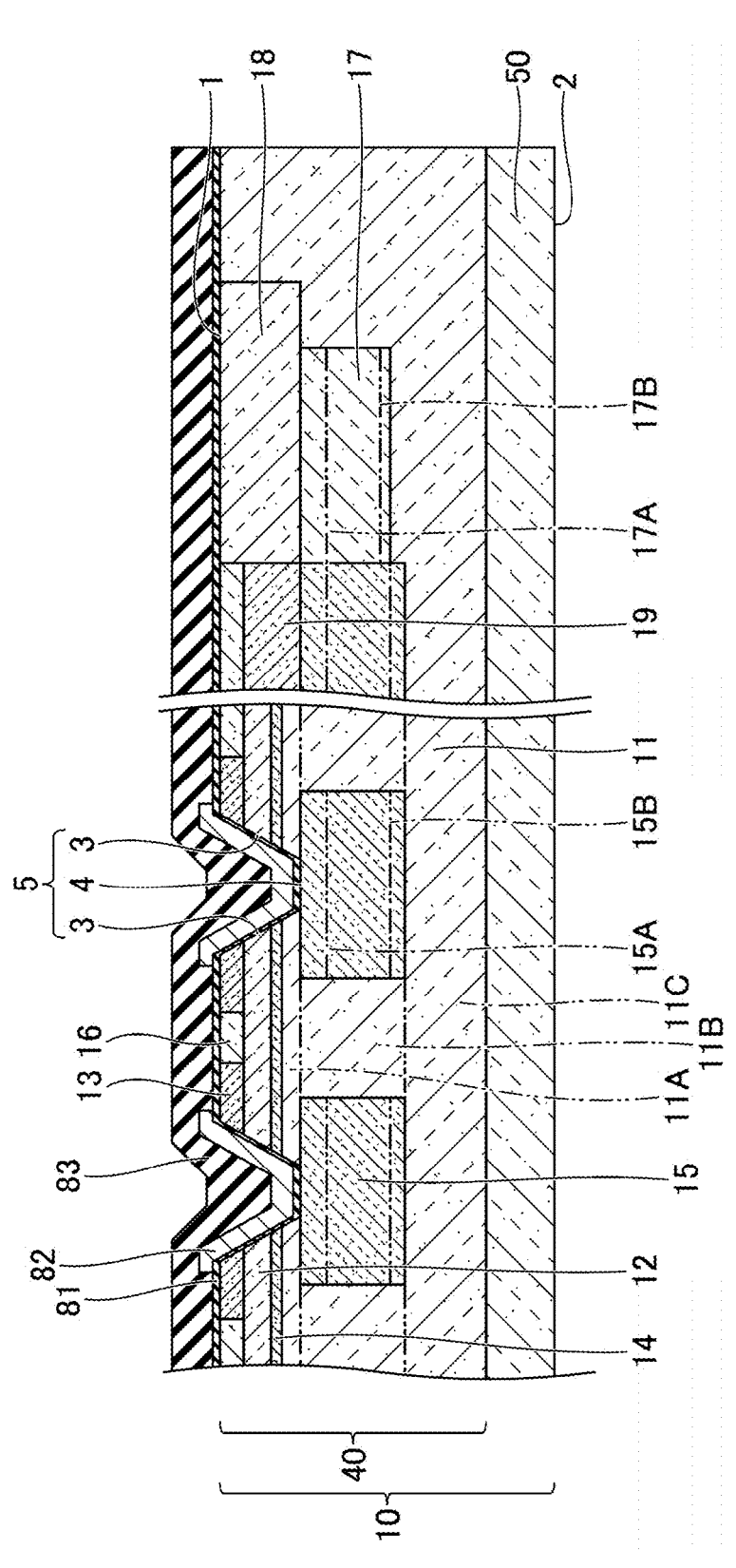
FIG. 10 is a cross-sectional view (part 7) illustrating the method for manufacturing the silicon carbide semiconductor device according to the embodiment.

Next, as illustrated in FIG. 10, the interlayer insulating film 83 is formed. Specifically, the interlayer insulating film 83 is formed to cover the gate electrode 82 and to contact the gate insulating film 81. The interlayer insulating film 83 is formed by, for example, a CVD method. The interlayer insulating film 83 is made of, for example, a material containing silicon dioxide. A portion of the interlayer insulating film 83 may be formed inside the gate trench 5.

Figure 11:
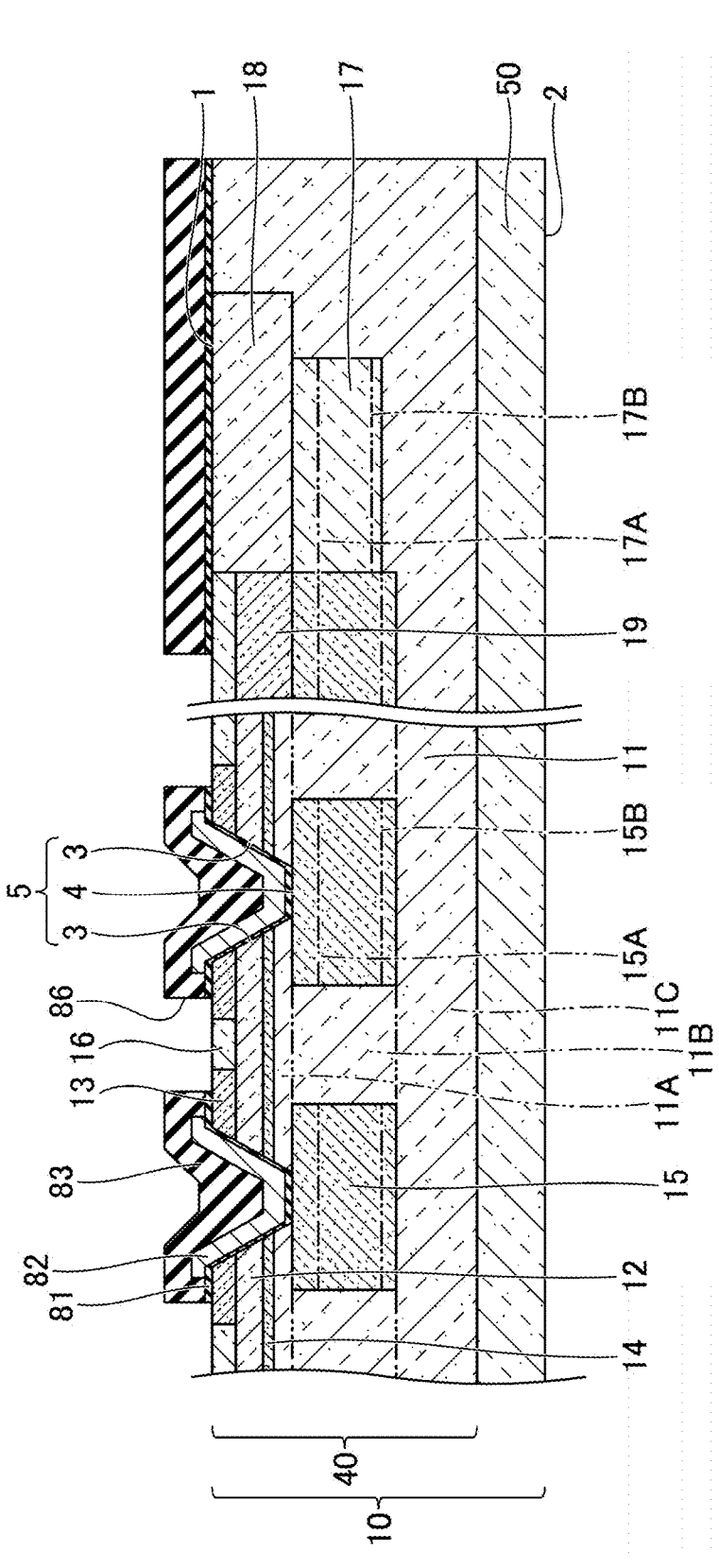
FIG. 11 is a cross-sectional view (part 8) illustrating the method for manufacturing the silicon carbide semiconductor device according to the embodiment.

Next, as illustrated in FIG. 11, the contact hole 86 is formed in the interlayer insulating film 83 and the gate insulating film 81. The contact region 16 is exposed from the interlayer insulating film 83 and the gate insulating film 81 in the contact hole 86.

Figure 12:
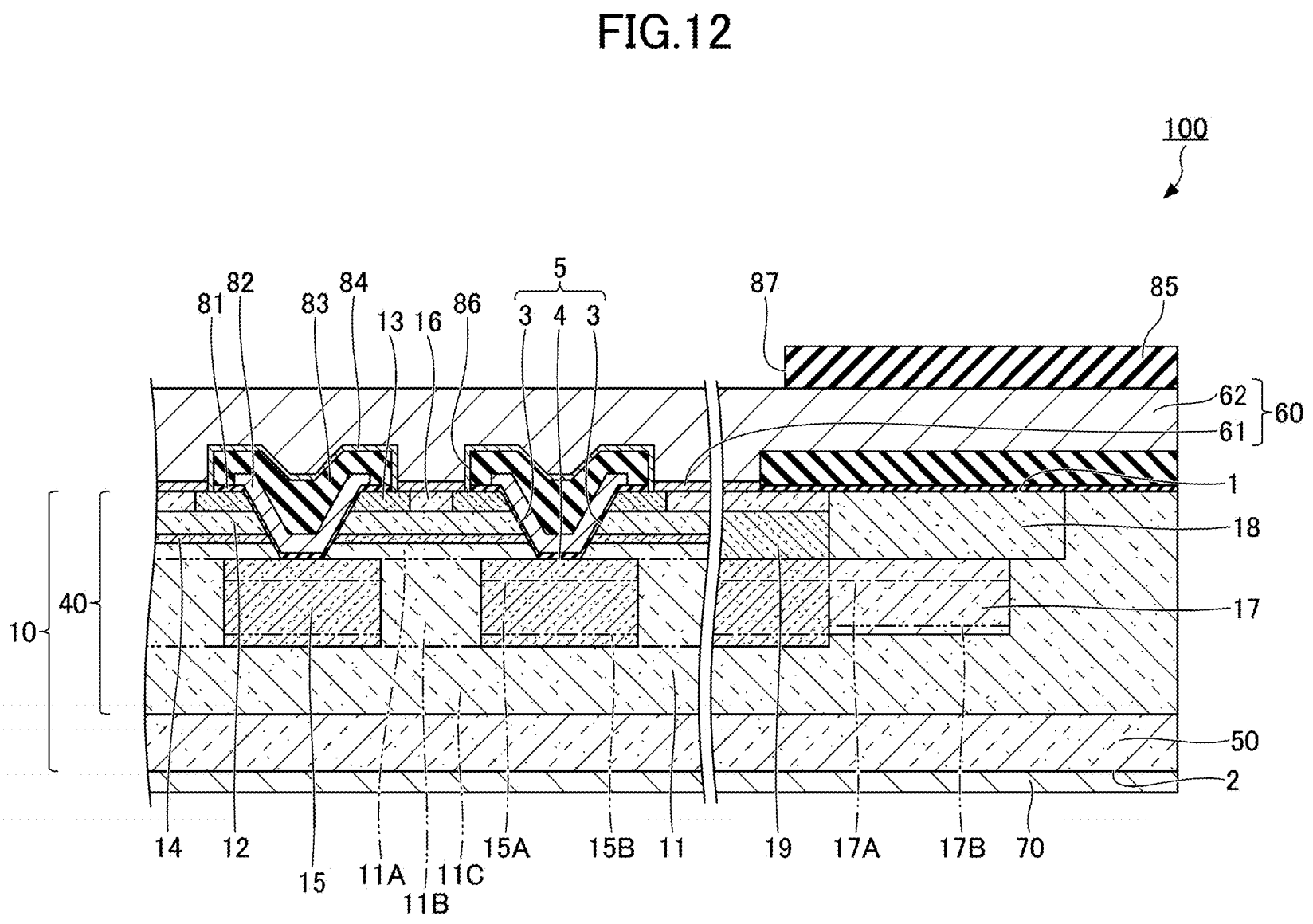

Next, as illustrated in FIG. 12, the barrier metal film 84, the contact electrode 61, and the drain electrode 70 are formed. For example, the barrier metal film 84 that covers the upper surface and the side surfaces of the interlayer insulating film 83 and the side surfaces of the gate insulating film 81 is formed. The barrier metal film 84 is made of, for example, a material containing titanium nitride. The barrier metal film 84 is formed by, for example, film deposition by a sputtering method and reactive ion etching (RIE). Next, a metal film (not illustrated) for the contact electrode 61 that is in contact with the contact region 16 at the first main surface 1 is formed. The metal film for the contact electrode 61 is formed by, for example, a sputtering method. The metal film for the contact electrode 61 is made of a material containing nickel, for example. Next, a metal film (not illustrated) for the drain electrode 70 that is in contact with the silicon carbide single-crystal substrate 50 at the second main surface 2 is formed. The metal film for the drain electrode 70 is formed by, for example, a sputtering method. The metal film for the drain electrode 70 is made of, for example, a material containing nickel.

Next, alloying annealing is performed. The metal film for the contact electrode 61 and the metal film for the drain electrode 70 are held at a temperature of, for example, 900° C. or greater and 1,100° C. or less for about 5 minutes. This causes at least a portion of the metal film for the contact electrode 61 and at least a portion of the metal film for the drain electrode 70 to react with silicon contained in the silicon carbide substrate 10 and be silicided. This forms the contact electrode 61 that is in ohmic contact with the contact region 16 and the drain electrode 70 that is in ohmic contact with the silicon carbide single-crystal substrate 50. The contact electrode 61 may be made of a material containing titanium, aluminum, and silicon. The drain electrode 70 may be made of a material containing titanium, aluminum, and silicon.

Next, the source interconnect 62 is formed. Specifically, the source interconnect 62 that covers the contact electrode 61 and the barrier metal film 84 is formed. The source interconnect 62 is formed by, for example, film deposition by a sputtering method and RIE. The source interconnect 62 is made of, for example, a material containing aluminum. As described, the source electrode 60 including the contact electrode 61 and the source interconnect 62 is formed.

Next, the passivation film 85 is formed. Specifically, the passivation film 85 that covers the source interconnect 62 is formed. The passivation film 85 is made of, for example, a material containing polyimide. The passivation film 85 is formed by, for example, a coating method. Next, the opening 87 is formed in the passivation film 85.

As described, the MOSFET 100 according to the embodiment is completed.

Next, operational effects of the MOSFET according to the present embodiment will be described.

In the MOSFET 100 according to the embodiment, in the electric field relaxation region 15, the distance between the first plane 15A where the concentration of the p-type impurity is the maximum value and the second plane 15B where the concentration of the p-type impurity is ¹⁄₁₀ of the maximum value is 1.0 µm or greater. Additionally, the distance D4 from the first main surface 1 to the interface 93 that is between the electric field relaxation region 15 and the drift region 11 is 2.0 µm or greater. Therefore, the source region 13, the body region 12, the drift region 11, and the electric field relaxation region 15 can be appropriately formed without forming the epitaxial layer multiple times. Additionally, because the concentration of the p-type impurity gradually changes in the electric field relaxation region 15, the breakdown voltage can be improved and the short-circuit current can be suppressed while obtaining a high breakdown voltage and suppressing the on-resistance. By suppressing the short-circuit current, the short-circuit resistance is improved. Additionally, even if heat is generated at the time of a short circuit, because the heat is generated at a location spaced apart from the first main surface 1, the influence of the heat on the source electrode 60 can be reduced, and the short circuit resistance can be improved.

Figure 13:
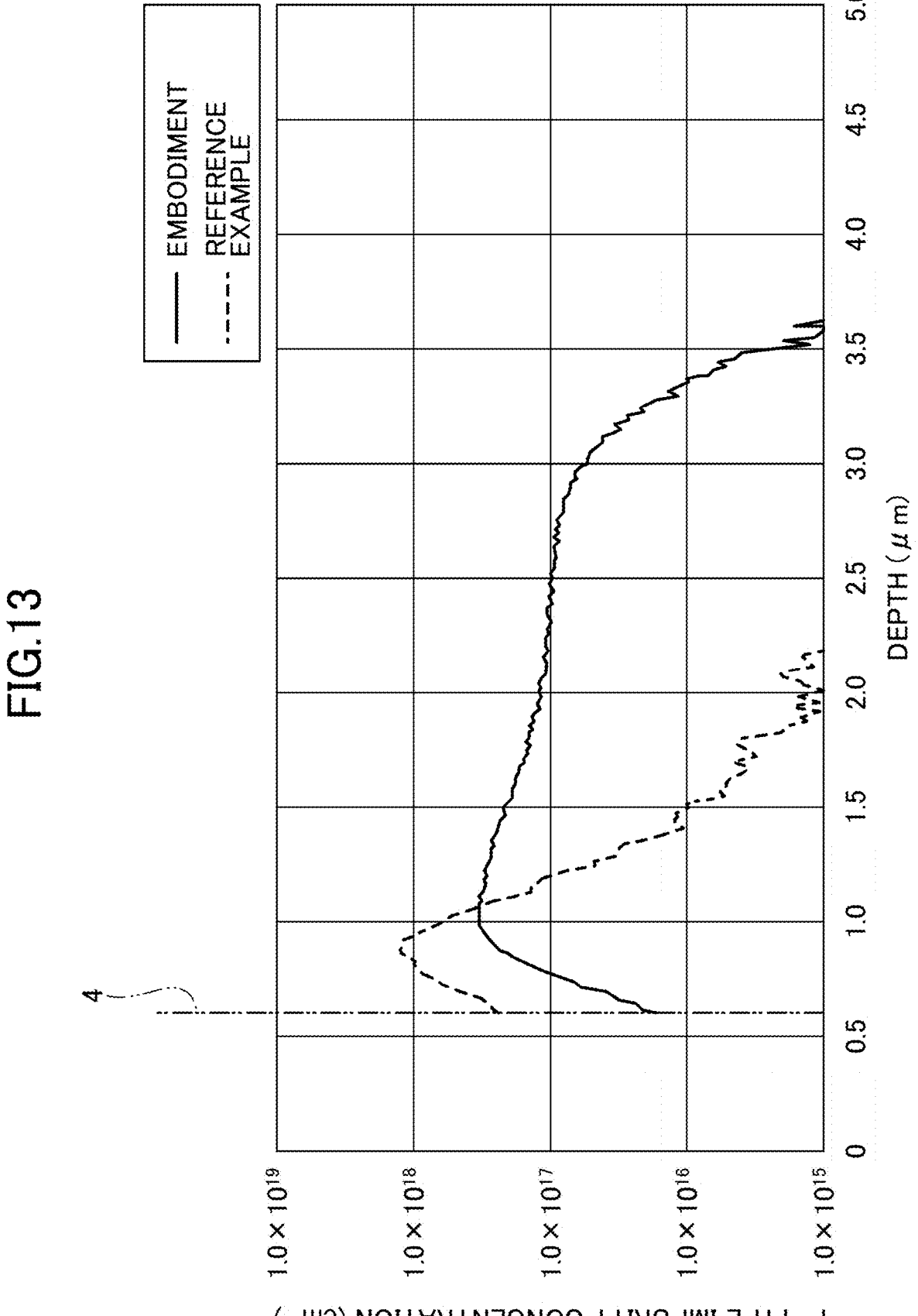
FIG. 13 is a graph illustrating examples of a concentration profile of a p-type impurity in an electric field relaxation region in the reference example and the embodiment.

Here, the effect of reducing the short-circuit current in comparison with a reference example in which a concentration profile of the p-type impurity in the electric field relaxation region 15 is different will be described. FIG. 13 is a graph illustrating an example of the concentration profile of the p-type impurity in the electric field relaxation region 15 in the reference example. In FIG. 13, the horizontal axis represents the distance from the first main surface 1, and the vertical axis represents the concentration of the p-type impurity. FIG. 13 also illustrates an example of a concentration profile in the embodiment.

As illustrated in FIG. 13, in the reference example, the change in the concentration of the p-type impurity is steep, and the distance between the first plane 15A and the second plane 15B is less than 1.0 µm. Additionally, in the reference example, the distance D4 from the first main surface 1 to the interface 93 that is between the electric field relaxation region 15 and the drift region 11 is less than 2.0 µm.

Figure 14:
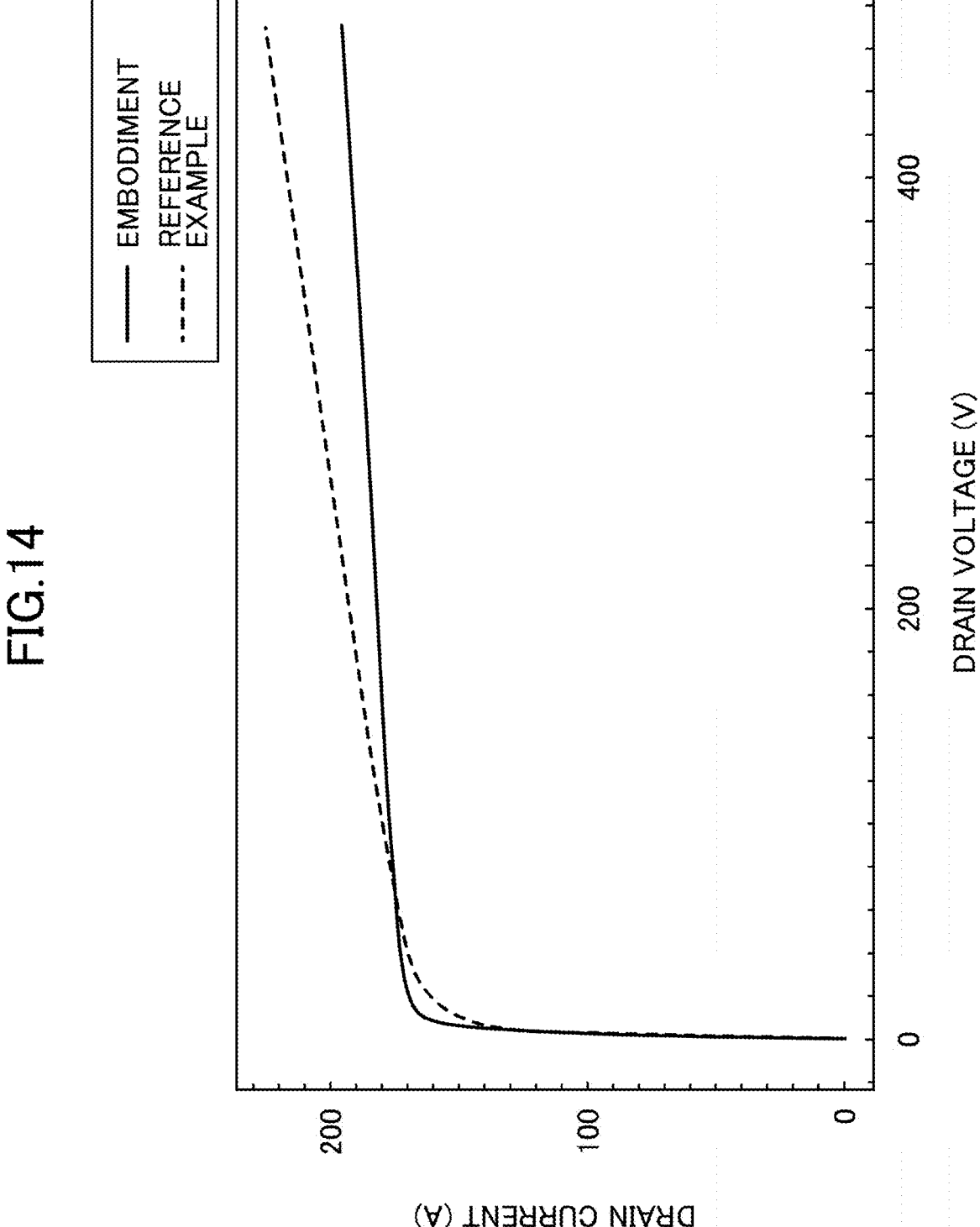
FIG. 14 is a graph illustrating a relationship between a drain voltage and a drain current in the embodiment and the reference example.

FIG. 14 is a graph illustrating a relationship between the drain voltage and the drain current in the embodiment and the reference example. In FIG. 14, the horizontal axis represents the drain voltage (the source-drain voltage) and the vertical axis represents the drain current. As illustrated in FIG. 14, according to the embodiment, in comparison with the reference example, the rate of change of the drain current relative to the change of the drain voltage when the drain voltage is greater than or equal to 20 V is suppressed. This indicates that the short-circuit current is suppressed by the embodiment.

Additionally, in the present embodiment, the total amount of the p-type impurity contained in the electric field relaxation region 15 is greater than the total amount of n-type impurity contained in the electric field relaxation region 15. As described above, the electric field relaxation region 15 can be formed by ion implantation of the p-type impurity into the epitaxial layer 21 being of the n-type conductivity. By adjusting the concentration of the n-type impurity and the concentration of the p-type impurity in the electric field relaxation region 15, desired on-resistance, breakdown voltage, and short-circuit resistance can be obtained.

In the present embodiment, in the buried JTE region 17 of the termination region 7, the distance between the third plane 17A where the concentration of the p-type impurity is the maximum value and the fourth plane 17B where the concentration of the p-type impurity is ¹⁄₁₀ of the maximum value is 1.0 µm or greater. Therefore, the breakdown voltage of the termination region 7 is caused to be greater than the breakdown voltage of the active region 6, thereby improving the avalanche resistance.

The buried JTE region 17 is electrically connected to the electric field relaxation region 15. Therefore, it is easy to control the electric field relaxation region 15 and the buried JTE region 17 at the same potential.

The distance between the first main surface 1 and the bottom surface 4 is preferably less than 0.8 µm, and the distance D2 between the first main surface 1 and the first plane 15A is preferably 0.8 µm or greater. In this case, it is easy to reduce the on-resistance in the region between the body region 12 and the electric field relaxation region 15, that is, in the current diffusion region 14 and the first region 11A.

The distance D2 between the first main surface 1 and the first plane 15A is, for example, 3.0 µm or less, preferably 2.0 µm or less, and more preferably 1.5 µm or less. As the distance D2 is decreased, the electric field relaxation region 15 is more easily formed by ion implantation through the first main surface 1.

Modified Example

Figure 15:
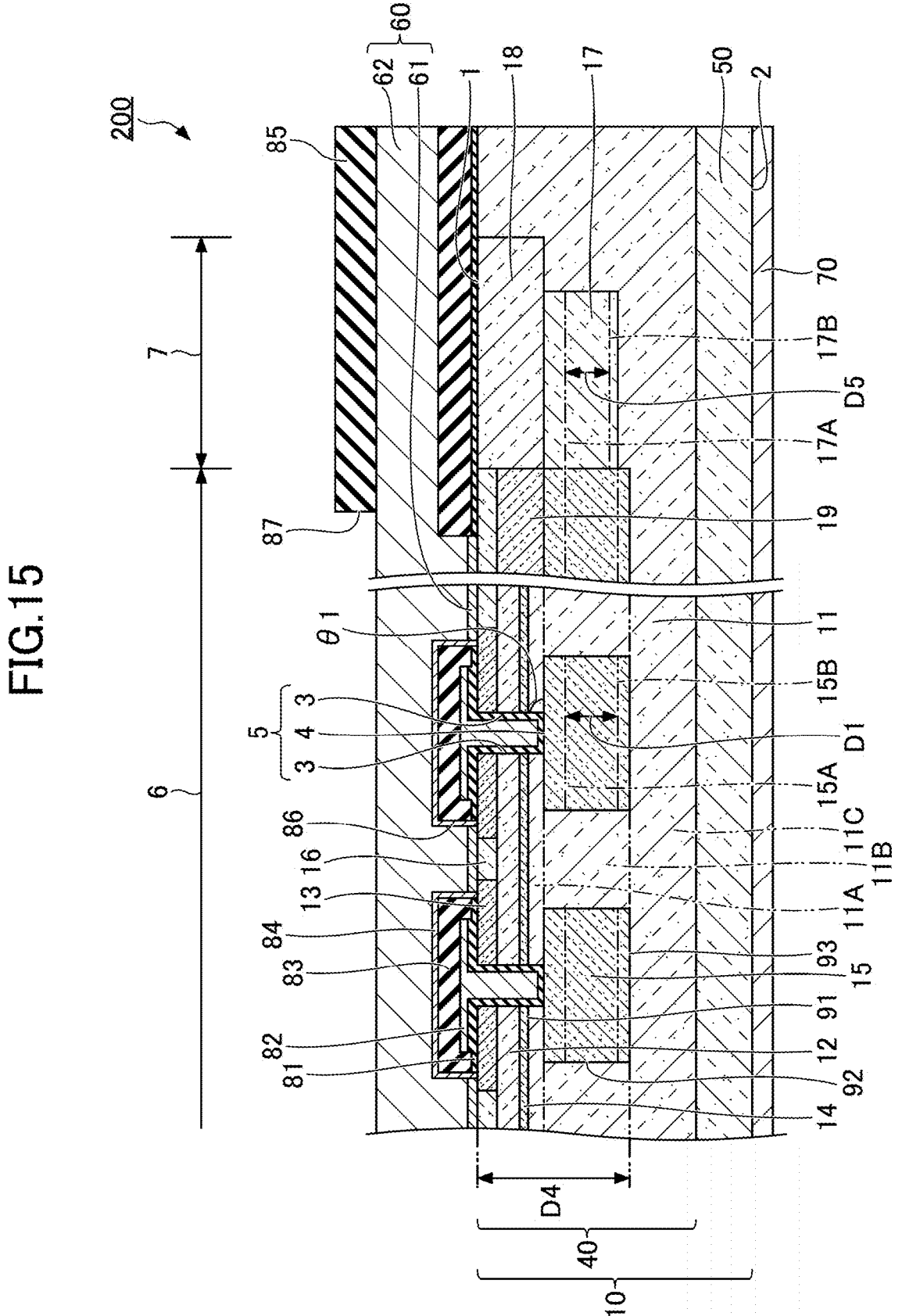
FIG. 15 is a cross-sectional view illustrating a configuration of a silicon carbide semiconductor device according to a modified example of the embodiment.

Next, a modified example of the embodiment will be described. The modified example is different from the embodiment mainly in the shape of the gate trench. FIG. 15 is a cross-sectional view illustrating a configuration of a MOSFET (silicon carbide semiconductor device) according to the modified example of the embodiment. FIG. 15 illustrates a cross-section similar to the cross-section taken along the line II-II in FIG. 1.

As illustrated in FIG. 15, in a MOSFET 200 according to the modified example, the gate trench 5 is a vertical trench. That is, the angle θ1 of the side surface 3 relative to a plane including the bottom surface 4 may be 90°. The other configurations are substantially the same as those of the embodiment.

Effects substantially the same as those of the embodiment can also be obtained by such a modified example.

In the embodiments and the reference example described above, the description has been made as the n-type being the first conductivity type and the p-type being the second conductivity type. However, the p-type may be the first conductivity type and the n-type may be the second conductivity type. Although the MOSFET has been described as an example of the silicon carbide semiconductor device in the embodiments and the reference example, the silicon carbide semiconductor device may be, for example, an insulated gate bipolar transistor (IGBT) or the like. The effective concentration of the p-type impurity and the effective concentration of the n-type impurity in each impurity region can be measured by, for example, a scanning capacitance microscope (SCM) method, a secondary ion mass spectrometry (SIMS) method, or the like. The position of the boundary surface between the p-type region and the n-type region (that is, the pn junction interface) can be specified by, for example, the SCM method, the SIMS method, or the like. The distribution of the effective concentration of the majority carrier in the current diffusion region can be specified based on, for example, the distribution of the thickness of a depletion layer generated by the pn junction between the current diffusion region and the body region without measuring the effective concentration. The thickness of the depletion layer can be specified by, for example, the SCM method or the SIMS method.

Here, the gate trenches may extend in a honeycomb fashion or may be scattered as islands.

Although the embodiments have been described in detail above, the embodiments are not limited to a specific embodiment, and various modifications and changes can be made within the scope described in the claims.

DESCRIPTION OF REFERENCE SYMBOLS 1 first main surface
2 second main surface
3 side surface
4 bottom surface
5 gate trench
6 active region
7 termination region
10 silicon carbide substrate
11 drift region
11A first region
11B second region
11C third region
12 body region
13 source region
14 current diffusion region
15 electric field relaxation region (first electric field relaxation region)
15A first plane
15B second plane
16 contact region
17 buried JTE region (second electric field relaxation region)
17A third plane
17B fourth plane
18 surface JTE region
19 connection region
21 epitaxial layer
40 silicon carbide epitaxial layer
50 silicon carbide single-crystal substrate
60 source electrode
61 contact electrode
62 source interconnect
70 drain electrode
81 gate insulating film
82 gate electrode
83 interlayer insulating film
84 barrier metal film
85 passivation film
86 contact hole
87 opening
91 first position
92 side end surface
93 interface
100, 200 MOSFET

The invention claimed is:

1. A silicon carbide semiconductor device comprising a silicon carbide substrate having a first main surface and a second main surface opposite to the first main surface, wherein the silicon carbide substrate includes:
a drift region being of a first conductivity type;
a body region provided on the drift region, the body region being of a second conductivity type different from the first conductivity type; and
a source region provided on the body region so as to be separated from the drift region, the source region being of the first conductivity type,
wherein a gate trench is provided on the first main surface, the gate trench being defined by side surfaces passing through the source region and the body region to reach the drift region and a bottom surface continuous with the side surfaces, wherein the silicon carbide substrate further includes a first electric field relaxation region provided between the bottom surface and the second main surface, the first electric field relaxation region being of the second conductivity type, wherein the first electric field relaxation region includes, in a direction perpendicular to the first main surface, a first plane in which a concentration of an impurity of the second conductivity type is a maximum value, and a second plane in which a concentration of the impurity of the second conductivity type is $1/10$ of the maximum value, the second plane being closer to the second main surface than the first plane is, wherein a distance between the first plane and the second plane is 1.0 μm or greater, and wherein a distance from the first main surface to an interface that is between the first electric field relaxation region and the drift region is 2.0 μm or greater.

2. The silicon carbide semiconductor device according to claim 1, wherein the first electric field relaxation region further contains an impurity of the first conductivity type, and wherein a total amount of the impurity of the second conductivity type contained in the first electric field relaxation region is greater than a total amount of the impurity of the first conductivity type contained in the first electric field relaxation region.

3. The silicon carbide semiconductor device according to claim 1, wherein a distance between the first main surface and the bottom surface is less than 0.8 μm, and wherein a distance between the first main surface and the first plane is 0.8 μm or greater.

4. The silicon carbide semiconductor device according to claim 1, wherein a maximum value of an effective concentration of the impurity of the second conductivity type in the body region is $1.0 \times 10^{18}$ cm$^{-3}$ or greater and $5.0 \times 10^{18}$ cm$^{-3}$ or less.

5. The silicon carbide semiconductor device according to claim 1, wherein the distance between the first main surface and the first plane is 3.0 μm or less.

6. The silicon carbide semiconductor device according to claim 1, wherein the silicon carbide semiconductor device has an active region including the body region, the source region, and the first electric field relaxation region, and has a termination region provided around the active region and including a second electric field relaxation region being of the second conductivity type, wherein the second electric field relaxation region includes, in the direction perpendicular to the first main surface, a third plane in which a concentration of the impurity of the second conductivity type is a maximum value, and a fourth plane in which a concentration of the impurity of the second conductivity type is $1/10$ of the maximum value, the fourth plane being closer to the second main surface than the third plane is, and wherein a distance between the third plane and the fourth plane is 1.0 μm or greater.

7. The silicon carbide semiconductor device according to claim 6, wherein the second electric field relaxation region is electrically connected to the first electric field relaxation region.

8. The silicon carbide semiconductor device according to claim 1, wherein the side surfaces of the gate trench include a {0-33-8} plane.

* * * * *